United States Patent [19]
Lakhani et al.

[11] Patent Number: 5,898,637
[45] Date of Patent: Apr. 27, 1999

[54] SYSTEM AND METHOD FOR SELECTING SHORTED WORDLINES OF AN ARRAY HAVING DUAL WORDLINE DRIVERS

[75] Inventors: Vinod C. Lakhani, Milpitas; Christophe J. Chevallier, Palo Alto, both of Calif.

[73] Assignee: Micron Technology, Inc., Boise, Id.

[21] Appl. No.: 08/778,615

[22] Filed: Jan. 6, 1997

[51] Int. Cl.$^6$ ............................................ G11C 8/00
[52] U.S. Cl. .............. 365/230.06; 365/200; 365/185.23; 365/230.04
[58] Field of Search ......................... 365/230.06, 230.03, 365/230.04, 200, 185.23

[56] References Cited

U.S. PATENT DOCUMENTS

| | | | |
|---|---|---|---|
| 5,602,778 | 2/1997 | Futatsuya et al. | 365/185.09 |
| 5,615,163 | 3/1997 | Sakui et al. | 365/203.03 |
| 5,629,898 | 5/1997 | Idei et al. | 365/222 |

*Primary Examiner*—David C. Nelms
*Assistant Examiner*—Hoai Ho
*Attorney, Agent, or Firm*—Schwegman, Lundberg, Woessner & Kluth, P.A.

[57] ABSTRACT

A memory system including an array of memory cells connected along wordlines and bitlines, wordline driver circuitry for driving at least two selected wordlines simultaneously in response to multirow selection bits, and selection bit circuitry for asserting multirow selection bits to the wordline driver circuitry in response to address bits (or address bits and control bits) to cause simultaneous selection of a target wordline and at least one other wordline shorted with the target wordline, and wordline selection methods performed by such a system. Preferably, the selection bit circuitry includes a predecoder implemented as a logic circuit, and the wordline driver circuitry includes a row decoder, a set of wordline drivers for driving even-numbered wordlines, and another set of wordline drivers for driving odd-numbered wordlines. The predecoder preferably includes an odd wordline predecoder for asserting selection bits for selecting at least one odd wordline of an erase block, and an even wordline predecoder for asserting selection bits for selecting at least one even wordline of the erase block. The system preferably includes a controller which generates a set of address bits for selecting a target wordline, and registers which store control bits which can be accessed by the predecoder to determine the predecoder's mode of operation. The invention allows shorted wordlines to be selected simultaneously during a programming operation (preliminary to an erase operation), to prevent the wordline supply from shorting to ground during the programming operation.

54 Claims, 12 Drawing Sheets

SYSTEM AND METHOD FOR SELECTING SHORTED WORDLINES OF AN ARRAY HAVING DUAL WORDLINE DRIVERS

BACKGROUND OF THE INVENTION

1. Field of the Invention

The invention pertains to a memory system having an array of memory cells connected along wordlines and bitlines, and two separate sets of wordline drivers for driving the wordlines (for example, a flash memory system of this type which includes an array of flash memory cells and emulates a magnetic disk drive). More specifically, the invention pertains to such a system (and a method for operating such a system) capable of simultaneously selecting two or more rows of cells of a memory cell array (each row connected along a different wordline), so that programming operations can be performed on, data can be written to, or data can be read from the selected rows simultaneously.

2. Description of Related Art

It is conventional to implement a memory system as an integrated circuit including an array of flash memory cells (or other non-volatile memory cells) and circuitry for independently erasing selected blocks of the cells, programming selected ones of the cells (i.e., writing data to selected ones of the cells), and reading data from selected ones of the cells.

Typically, a flash memory cell array comprises flash memory cells arranged in rows and columns, with each row connected along a different wordline and each column connected along a different bitline. A flash memory cell is typically implemented by a floating-gate N-channel transistor (such as transistor 14A shown schematically in FIG. 2, to be discussed below). All the cells in a column have their drain regions connected to a common bitline, and all the cells in a row have their control gates connected to a common wordline. All the cells have their sources connected to a source line (typically a common source line that is shared by all cells).

A wordline driver applies a selected voltage to each wordline. In a typical architecture, the wordlines are driven by two physically separated sets of wordline drivers (e.g., one set of address decoding and wordline driving circuitry on the left side of the array which drives the even numbered wordlines, and a second set of address decoding and wordline driving circuitry on the right side of the array which drives the odd numbered wordlines).

It is also conventional to design a flash memory system to emulate a magnetic disk drive system, so that an external device (e.g., host processor) can address the cells of the array in a manner emulating that in which conventional magnetic disk storage locations are addressed.

The dominant computer operating system known as "DOS" (Disk Operating System) is essentially a software package used to manage a disk system. DOS has been developed by IBM Corporation, Microsoft Corporation, and Novell as the heart of widely used computer software. The first generation of Microsoft Corporation's "Windows" operating system software was essentially a continuation of the original DOS software with a user friendly shell added for ease of use.

The DOS software was developed to support the physical characteristics of magnetic hard disk drive structures, and thus supports file structures based on heads, cylinders and sectors. The DOS software stores and retrieves data based on these physical attributes. Magnetic hard disk drives operate by storing polarities on magnetic material. This material is able to be rewritten quickly and as often as desired. These characteristics have allowed DOS to develop a file structure that stores files at a given location which is updated by a rewrite of that location as information is changed. Essentially all locations in DOS are viewed as fixed and do not change over the life of the disk drive being used therewith, and are easily updated by rewrites of the smallest supported block of this structure. A sector (of a magnetic disk drive) is the smallest unit of storage that the DOS operating system will support. In particular, a sector has come to mean 512 bytes of information for DOS and most other operating systems in existence. DOS also uses clusters as a storage unit. Clusters, however, are nothing more than the logical grouping of sectors to form a more efficient way of storing files and tracking them with less overhead.

The development of flash memory integrated circuits has enabled a new technology to offer competition to magnetic hard drives and offer advantages and capabilities that are hard to support by disk drive characteristics and features. The low power, high ruggedness, and small sizes offered by a solid state flash memory system make such a flash memory system attractive and able to compete with a magnetic hard disk drive system. Although a memory implemented with flash memory technology may be more costly than a hard disk drive system, computers and other processing systems are being developed that require (or benefit greatly from) use of flash memory features.

Thus, flash memory systems have been developed that emulate the storage characteristics of hard disk drives. Such a flash memory system is preferably structured to support storage in 512 byte blocks along with additional storage for overhead bits associated with mass storage, such as ECC (error correction code) bits. A key to this development is to make the flash memory array respond to a host processor in a manner that looks like a disk so the operating system can store and retrieve data in a known manner and be easily integrated into a computer system including the host processor.

In some flash memory systems that emulate the storage characteristics of hard disk drives, the interface to the flash memory is identical to a conventional interface to a conventional magnetic hard disk drive. This approach has been adopted by the PCMCIA standardization committee, which has promulgated a standard for supporting flash memory systems with a hard disk drive protocol. A flash memory card (including one or more flash memory array chips) whose interface meets this standard can be plugged into a host system having a standard DOS operating system with a PCMCIA-ATA (or standard ATA) interface. Such a flash memory card is designed to match the latter standard interface, but must include an onboard controller which manages each flash memory array independent of the host system.

Memory systems having arrays of cells connected along bitlines and wordlines (e.g., flash memory system of any of the types described above) are often manufactured with defects of the following type: there is at least one short circuit between at least one pair of the wordlines. Each such short circuit can allow undesirable current flow from one to another of the shorted wordlines in certain circumstances, which can cause read failures when attempting to read cells connected along any of the shorted wordlines, and which can cause failure of a programming operation performed (on cells connected along any of the shorted wordlines) preliminary to an erase operation.

Thus, when such a wordline-to-wordline short circuit has been identified (e.g., as a result of any suitable conventional test procedure), one of the following measures must be taken:

all the shorted wordlines are selected simultaneously prior to (and during) each programming operation, to prevent the wordline supply (the source of voltage applied to the relevant wordlines) from shorting to ground during the programming operation; or the system avoids programming one or more blocks of cells including all cells connected along the shorted wordlines (e.g., it avoids programming an erase block which includes all cells connected along the shorted wordlines), the system avoids subsequent programming or reading of each such block, and the system replaces any data previously stored in each such block (by programming the same data to one or more substitute blocks).

Until the present invention it had not been known how efficiently to perform such simultaneous selection of shorted wordlines, particularly in cases in which the shorted wordlines are driven by different wordline driver circuits (e.g., in cases in which one wordline is driven by a first wordline driver circuit on one side of the array and another wordline is driven by a second wordline driver circuit on the other side of the array.

SUMMARY OF THE INVENTION

The memory system of the invention includes an array of memory cells connected along wordlines and bitlines, wordline driver circuitry configured to drive at least two selected wordlines simultaneously in response to multirow selection bits, and selection bit circuitry coupled to the wordline driver circuitry and configured to assert multirow selection bits to the wordline driver circuitry in response to control signals and address bits (or in response to address bits alone) to cause simultaneous selection of a target wordline and at least one other wordline which is shorted with the target wordline. The selection bit circuitry includes address predecoding circuitry, preferably implemented as a logic circuit (i.e., a simple hardwired logic circuit). Also preferably, the wordline driver circuitry includes a row decoder and two sets of wordline drivers. The row decoder is coupled to receive selection bits (such as the multirow selection bits) and configured to generate decoded selection bits in response to the selection bits. Each set of wordline drivers is for driving a different subset of the wordlines in response to a different subset of the decoded selection bits.

In some embodiments, one set of wordline drivers drives even-numbered wordlines (i.e., a first wordline WL0, a third wordline WL2, and so on) and the other set of wordline drivers drives odd-numbered wordlines (a second wordline WL1, a fourth wordline WL3, and so on), and the array is organized in erase blocks (so that all cells connected along all the wordlines in each erase block can be simultaneously selected for simultaneous erasure). In such embodiments, the predecoding circuitry preferably includes two wordline predecoders: an odd-wordline predecoder for asserting selection bits for selecting at least one odd-numbered wordline of the erase block; and an even-wordline predecoder for asserting selection bits for selecting at least one even-numbered wordline of the erase block. The wordline predecoders can operate in a first mode in which they output multirow selection bits (to the wordline drivers for the erase block) which simultaneously select shorted-together wordlines of the erase block in response to control bits and address bits (or in response to address bits alone, in alternative embodiments). Preferably, each pair of wordline predecoders is also operable in any selected one of the following modes (at times when it is not operating in the first mode): a second mode in which it asserts single row selection bits in response to address bits (where the address bits determine a single wordline of the erase block), a third mode in which it asserts all-row selection bits in response to at least one control bit (where the address bits select an erase block and the all-row selection bits select all the wordlines of the selected erase block), and a fourth mode in which the pair of wordline predecoders asserts row deselection bits in response to address bits and at least one other control bit (where the address bits select an erase block, and the row deselection bits deselect all wordlines of the selected erase block).

In some embodiments, the system includes a controller which generates two sets of address bits: a first set for selecting even-numbered wordlines; and a second set for selecting odd-numbered wordlines. The predecoding circuitry includes an odd-wordline predecoder and an even-wordline predecoder, and is operable in a mode in which the even-wordline predecoder receives the first set of address bits, the odd-wordline predecoder receives the second set of address bits, and the predecoders together output multirow selection bits. In preferred implementations of these embodiments, each wordline predecoder comprises identical logic circuitry for generating selection bits (or deselection bits) in response to the received address bits.

In preferred embodiments, the system includes a controller which generates a single set of address bits for selecting a single target wordline. The predecoding circuitry includes an odd-wordline predecoder and an even-wordline predecoder, and is operable in a mode in which the even-wordline predecoder receives the set of address bits (with a first set of control bits), the odd-wordline predecoder receives the same set of address bits (with a second set of control bits), and the predecoders together output multirow selection bits. In preferred implementations of these preferred embodiments as well, each wordline predecoder comprises identical logic circuitry for generating selection bits (or deselection bits) in response to the received address and control bits.

Preferably, the system includes registers in which at least some of the control bits are stored, and the predecoding circuitry receives relevant ones of the control bits from selected ones of the registers. The received control bits determine the mode of operation of each wordline predecoder. Preferably, the system includes a controller programmed to replace the stored control bits at desired times by loading replacement bits into each register.

The invention allows shorted wordlines to be selected simultaneously during a programming operation (performed preliminary to an erase operation), to prevent the wordline supply from shorting to ground during the programming operation.

Preferably, the memory cells of the inventive system are flash memory cells. Also preferably, the system is implemented as an integrated memory circuit (memory chip). Other embodiments of the invention are wordline selection methods of any of the types which can be performed by various embodiments of the inventive system.

DETAILED DESCRIPTION OF THE PREFERRED EMBODIMENTS

Throughout the disclosure, including in the claims, the term "bits" (as in address "bits") is used to denote signals indicative of bits of information (e.g., signals indicative of ones and zeros). For example, "multirow selection bits" denotes signals indicative of a set of binary bits (or non-binary bits), where the binary bits (or non-binary bits) determine two or more wordlines to be simultaneously selected, where a row of memory cells is connected along each of the wordlines. A "set of control bits" denotes one or more signals indicative of one or more bits of information, in the sense that one "set of control bits" indicative of the ordered set of binary values "001" differs from a second set of control bits which is indicative of the ordered set of binary values "101".

Preferred embodiments of the invention will be described with reference to FIGS. 1–12. One such embodiment is flash memory system 30 shown in FIG. 1 which includes array 16 of flash memory cells.

Flash memory system 30 is designed to emulate a magnetic disk drive system. Although system 30 can be implemented as a single integrated circuit, it is not necessarily implemented as a single integrated circuit (for example, each of two or more integrated circuits can implement a different portion of array 16), and the following description of system 30 will not assume that it is an integrated circuit.

Figure 1:
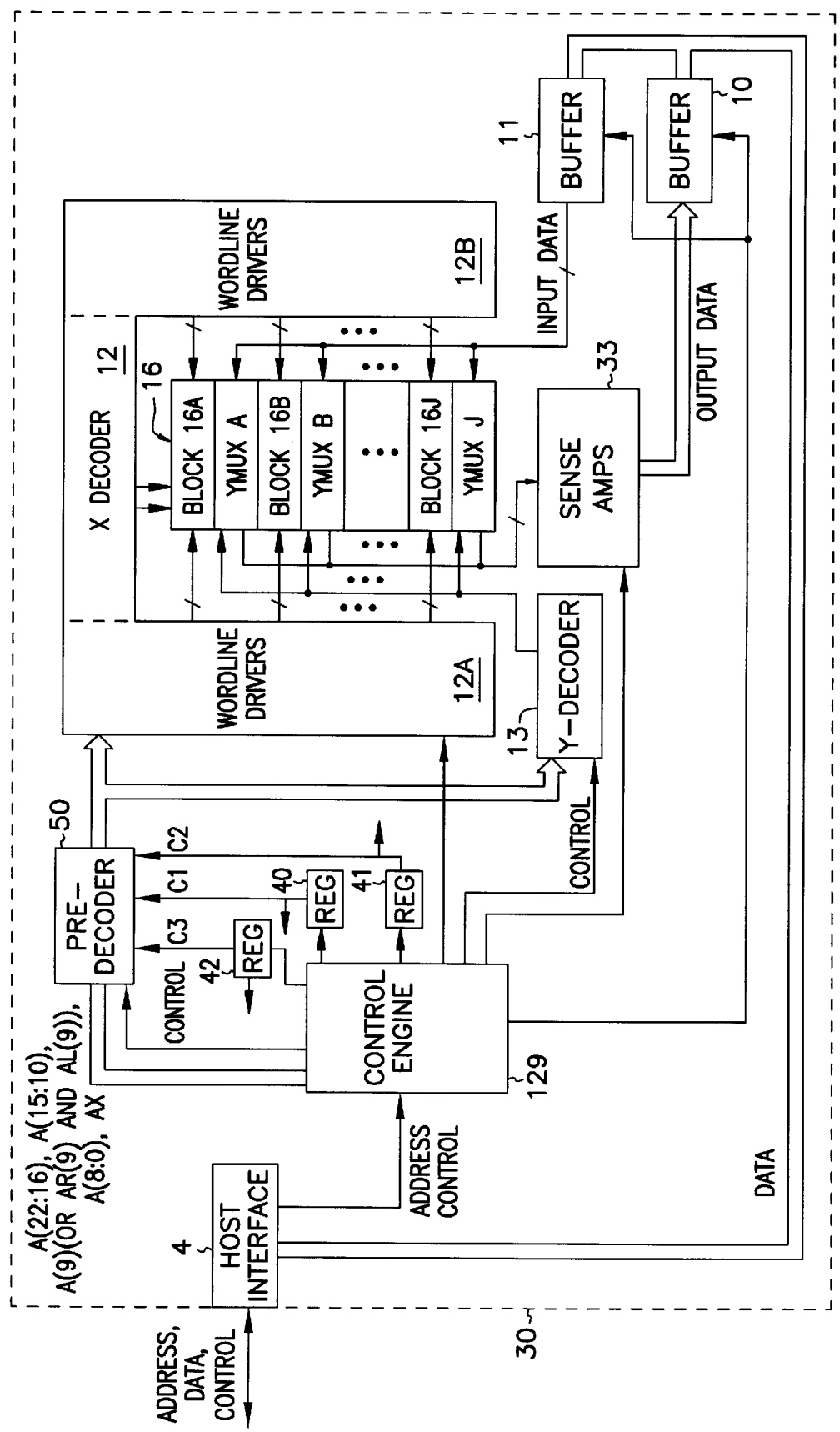
FIG. 1 is simplified block diagram of an embodiment of the inventive nonvolatile (flash) memory circuit, including a controller for controlling memory operations of the circuit.

Flash memory system 30 of FIG. 1 includes memory cell array 16, which comprises rows and columns of flash memory cells (each row of cells connected along a different wordline, and each column of cells connected along a different bitline). In one implementation, array 16 comprises 8192 wordlines and 4352 bitlines (along which a total of 8192×4352 cells are connected, of which 8192 cells are connected along each bitline), and a set of eight sense amplifiers is provided within circuit 33 for reading eight cells of array 16 at a time (in parallel), each of the eight cells being connected along a different bitline. Alternatively, each column of cells of array 16 consists of several groups of cells, and each group of cells is connected along a different bitline. An example of the latter embodiment is one in which array 16 comprises 8192 wordlines and 8×4352=34,816 bitlines (along which a total of 8192×4352 cells are connected, with 1024 cells connected along each bitline), wherein array 16 consists of eight main blocks of cells (each main block comprising 1024 wordlines and 4352 bitlines), each bitline is entirely contained within a single main block, and a separate set of sense amplifiers is provided within circuit 33 for reading each main block of cells (e.g., sixty-four sense amplifiers are provided, of which eight sense amplifiers are used to read eight cells of each main block in parallel, each cell being read being connected along a different bitline).

Flash memory system 30 also includes row decoder circuit (X address decoder) 12, which includes two physically separated sets of wordline drivers: a first set of wordline drivers 12A (positioned physically nearest to the bitline extending along the left side of array 16), and a second set of wordline drivers 12B (positioned physically nearest to the bitline extending along the right side of array 16).

Each cell of array 16 is a flash memory cell, of a type to be described with reference to FIG. 2. In alternative embodiments, each cell is a memory cell other than a flash memory cell (e.g., a non-volatile memory cell other than a flash memory cell).

Figure 2:
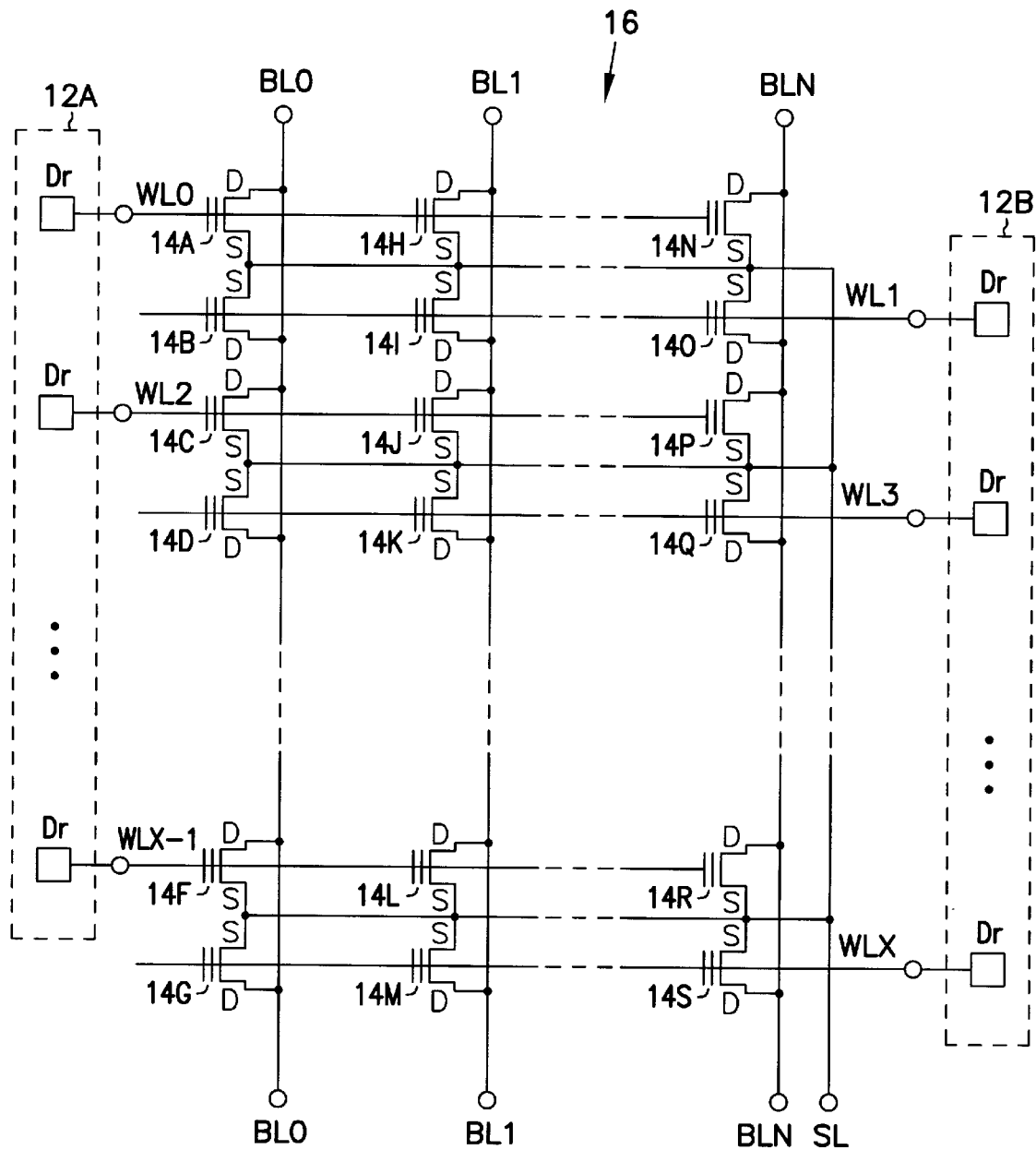
FIG. 2 is a simplified schematic diagram of memory array 16 of FIG. 1, and a block diagram of wordline driver circuitry (a portion of circuit 12 of FIG. 1) for driving the wordlines of the array.

We refer to the wordlines of array 16 as being numbered consecutively from top to bottom of array 16, so that (with reference to FIG. 2) the wordlines are: wordline "WL0," wordline "WL1," wordline "WL2," . . . , wordline "WL(X-1)," and wordline "WLX" (where X is an odd integer as shown in FIG. 2). Thus the wordlines include even-numbered wordlines (e.g., wordline WL2) and odd-numbered wordlines (e.g., wordline WL1). Although array 16 has an even number of wordlines as shown in FIG. 2, array 16 could, of course, alternatively be implemented with an odd number of wordlines.

In the FIG. 2 implementation of memory array 16 of FIG. 1, array 16 includes flash memory cells 14A through 14S (collectively referred to as cells 14) arranged in rows and columns. Each cell 14 is implemented by a floating-gate N-channel transistor, as shown schematically. All the cells 14 in a particular column have their drain regions connected to a common bitline (one of bitlines BL0 through BLN) and all the cells in a particular row have their control gates connected to a common wordline (one of wordlines WL0 through WLX). All of cells 14 have their sources connected to a common source line SL. Alternatively, it is possible to arrange the cells into array segments having separate source lines that can be sequentially accessed during an erase cycle (e.g., to reduce the maximum erase current). The source potential at which the sources of cells 14 are held (during a read or programming operation) is usually ground potential for the system.

Flash memory cells 14 of array 16 are arranged in column pairs, with the cells of each pair sharing a common source region. As an example, the pair consisting of cells 14J and 14K has a common source region connected to the source line SL. The drain region of each cell 14 is connected to the bitline (one of BL0 through BLN) associated with the column in which the cell is located. As an example, each of cells 14H, 14I, 14J, 14K, 14L, and 14M has its drain region connected to bitline BL1.

The wordlines of array 16 of FIG. 2 are driven by two physically separated sets of wordline drivers: a first set of wordline drivers 12A (positioned physically nearest to bitline BL0), and a second set of wordline drivers 12B (positioned physically nearest to bitline BLN). Each of the control gates of each of the cells connected along the even-numbered wordlines (wordlines WL0, WL2, ... WLX-1) is driven by a driver circuit "Dr" within set 12A (i.e., each driver circuit "Dr" within set 12A asserts an appropriate control voltage to each such control gate). Each of the control gates of each of the cells connected along the odd-numbered wordlines (wordlines WL1, WL3, ... WLX) is driven by a driver circuit "Dr" within set 12B (i.e., each driver circuit "Dr" within set 12B asserts an appropriate control voltage to each such control gate).

In preferred implementations, main blocks and erase blocks of array 16 are independently selectable, with each erase block comprising the cells connected along a number of wordlines (preferably 128 wordlines), and each main block comprising a number (e.g., eight) of the erase blocks. In such implementations, set 12A includes subsets of drivers "Dr" (one subset for each erase block), each such subset receives decoded selection bits (or decoded deselection bits) from a different erase block decoder within circuit 12, and each erase block decoder receives selection (or deselection) bits from a wordline predecoder within circuit 50. For example, drivers Dr for the first 64 even-numbered wordlines (even-numbered wordlines WL0–WL126) receive decoded selection bits from erase block decoder 12C shown in FIG. 3, and erase block decoder 12C receives selection bits XAL(7:0) and XBL(7:0) from even-wordline predecoder 50L shown in FIG. 7. Also in such implementations, set 12B includes subsets of drivers "Dr" (one subset for each erase block), each such subset receives decoded selection bits (or decoded deselection bits) from a different erase block decoder within circuit 12, and each of the erase block decoders receives selection (or deselection) bits from a wordline predecoder within circuit 50. For example, drivers Dr (within set 12B) for the first 64 wordlines (odd-numbered wordlines WL1–WL127) receive decoded selection bits from a second erase block decoder (having the structure of decoder 12C of FIG. 3), and the second erase block decoder receives selection bits XAR(7:0) and XBR(7:0) from odd-wordline predecoder 50R shown in FIG. 8.

With reference again to FIG. 1, the drivers comprising set 12A are positioned along the left side of array 16 and are connected to the control gates of the flash memory cells of array 16 that are connected along the even-numbered wordlines of array 16, and the drivers comprising set 12B are positioned along the right side of array 16 and connected to the control gates of the cells connected along the odd-numbered wordlines of array 16. This arrangement of drivers 12A and 12B provides most efficient use of the area of system 30, allowing system 30 to be implemented with a smaller overall size than if all of drivers 12A and 12B were positioned on the same side of array 16.

Still with reference to FIG. 1, memory system 30 includes control engine (or "controller") 129, registers 40, 41, and 42, output buffer 10, input buffer 11, and host interface 4. Host interface 4 asserts data from output buffer 10 (e.g., data read from array 16) to an external device (not shown), and asserts input data from the external device to input buffer 11 (so that such input data can be written to array 16). Alternatively, where host interface 4 includes input and output data buffers, buffers 10 and 11 can be eliminated and the data buffers within interface 4 used in place of them.

Controller 129 controls detailed operations of system 30 such as the various individual steps necessary for carrying out programming, reading, and erasing operations. Controller 129 thus functions to reduce the overhead required of the external device (not depicted) typically used in association with system 30.

Host interface 4 also includes an address buffer for receiving external address bits from the external device, and is configured to send buffered address bits (including bits identifying cylinder, head, and sector addresses) to controller 129 in response to receiving external address bits from the external device. Host interface 4 also generates control signals in response to external control signals received from the external device (e.g., erase, write, or read commands), and asserts the control signals to controller 129.

For convenience throughout this disclosure, we use the following notation to describe address bits. "A(Y:Z)" denotes a set of (Y–(Z–1)) address bits, consisting of binary bits $A_Y, A_{Y-1}, \ldots A_{Z+1}$, and $A_Z$. For example, A(8:0) denotes the following nine address bits: $A_8, A_7, A_6, A_5, A_4, A_3, A_2, A_1$, and $A_0$. Similarly, "AL(Y:Z)" denotes a set of (Y–(Z–1)) address bits consisting of binary bits $AL_Y, AL_{Y-1}, \ldots AL_{Z+1}$, and $AL_Z$, and "AR(Y:Z)" denotes a set of (Y–(Z–1)) address bits consisting of binary bits $AR_Y, AR_{Y-1}, \ldots, AR_{Z+1}$, and $AR_Z$.

Controller 129 is designed and programmed to control predecoder 50, to cause predecoder 50 to assert selection (or deselection) bits to decoder circuits 12 and 13 for selecting a cell (or two or more cells) connected along a single wordline of array 16 in response to a set of buffered address bits received from host interface 4. Controller 129 can be designed and programmed in a conventional manner to accomplish this function. Controller 129 is also designed and programmed to assert control signals to cause predecoder 50 to assert multi-row selection bits to decoder 12 (in a manner to be explained below) for simultaneously selecting multiple rows of array 16 (multiple rows that are shorted together) in accordance with the invention.

In response to receiving address bits (including bits identifying cylinder, head, and sector addresses) from an external device, interface 4 buffers these address bits and asserts the buffered address bits to control engine 129. In response to a set of buffered address bits from interface 4, control engine 129 translates these bits to generate internal address bits A(22:0) and AX (or internal address bits A(22:16), AL(15:9), AR(15:9), A(8:0) and AX in a below-described variation on the FIG. 1 embodiment), and control engine 129 asserts the internal address bits to predecoder 50.

In modes of operation in which a cell (or a set of cells) in a single row of array 16 is to be selected, controller 129 generates and asserts to predecoder 50 (in response to a set of buffered address bits received from host interface 4) the internal address bits A(22:0) and AX. At least one of bits A(15:9) is high when a single even-numbered wordline driven by wordline driver set 12A is to be selected (except that all of bits A(15:9) are low to select wordline WL0), and a different set of at least one of bits A(15:9) is high when a single odd-numbered wordline driven by wordline driver set 12B is to be selected (only bit A9 is high to select wordline WL1). In modes of operation for simultaneously selecting multiple, shorted-together rows of array 16, controller 129 generates and asserts to predecoder 50 (in response to a set of buffered address bits received from host interface 4) the internal address bits A(22:0) and AX. Bit A9 selects either an even-numbered wordline (driven by wordline driver set 12A), or an odd-numbered wordline (driven by wordline driver set 12B). More specifically, A9=1 selects an odd-numbered wordline, and A9=0 selects an even-numbered wordline. Controller 129 loads control bits into registers 40, 41, and 42, and predecoder 50 accesses these control bits and processes these control bits, address bits A(15:9), and additional control bits from controller 129 (in a manner to be explained below) in order to generate multi-row selection bits (for assertion from predecoder 50 to decoder 12).

In a variation on the preferred embodiment described in the previous paragraph, controller 129 generates and asserts to predecoder 50 (in response to a set of buffered address bits received from host interface 4) the internal address bits A(22:16), AL(15:9), AR(15:9), A(8:0), and AX. In modes of operation of predecoder 50 for selecting a single wordline, bits AL(15:9) are processed to select an even-numbered wordline (driven by wordline driver set 12A), and bits AR(15:9) are processed to select an odd-numbered wordline (driven by wordline driver set 12B). Bit AR(9) is low and bit AL(9) is high when a single even-numbered wordline driven by wordline driver set 12A is to be selected. Bit AL(9) is low and bit AR(9) is high when a single odd-numbered wordline driven by wordline driver set 12B is to be selected. In one such alternative embodiment, predecoder 50 is implemented to include the circuitry described below with reference to FIGS. 13 and 14.

With reference again to the preferred embodiment, in modes of operation for simultaneously selecting multiple wordlines (rows) of array 16, controller 129 generates and asserts to predecoder 50 (in response to a set of buffered address bits received from host interface 4) the internal address bits A(22:0) and AX. Bits A(15:9) select one target wordline (either an even-numbered wordline or an odd-numbered wordline). Controller 129 loads control bits into registers 40, 41, and 42, and predecoder 50 accesses these control bits and processes these control bits, address bits A(15:9), and additional control bits from controller 129 (in a manner to be explained below) in order to generate multi-row selection bits (for assertion from predecoder 50 to decoder 12) for selecting each wordline to be selected.

Throughout the disclosure (including in the claims), the expression "target" cell is used to denote a memory cell to be erased, programmed, or read. The expression "target" wordline is used to denote a wordline (of a memory array) along which a target cell is attached (or along which two or more target cells are attached), and the expression "target" row is used to denote a row (of a memory array) which includes at least one target cell.

In preferred embodiments, controller 129 is programmed with data indicative of each group of at least two wordlines of array 16 that have been determined to be shorted together, and is programmed to generate (and load into registers 40–42) control bits for use by predecoder 50 during generation of multi-row selection bits for simultaneously selecting shorted-together rows. In response to command bits and buffered address bits indicating an access of a target row (or a target cell or cells in such target row) which is shorted with another row, controller 129 asserts to predecoder 50 internal address bits (A(22:0) and AX) and control signals (e.g., control bit WLSHIGH), and ensures that appropriate control bits C1, C2, and C3 have been loaded into registers 40–42, to cause predecoder 50 to assert multi-row selection bits for simultaneously selecting the target row and a row shorted with the target row. In alternative embodiments, predecoder 50 is designed (and receives address and control bits) so that it asserts multi-row selection bits for simultaneously selecting a target row and all rows shorted with the target row (where there may be more than one row shorted with the target row).

In variations on the preferred embodiments described in the previous paragraph, in response to command bits and buffered address bits indicating an access of a target row (or a target cell or cells in such target row) which is shorted with another row, controller 129 asserts to predecoder 50 internal address bits (A(22:16), AR(15:9), AL(15:9), A(8:0), and AX) and preferably also control signals (e.g., control bit WLSHIGH), to cause predecoder 50 to assert multi-row selection bits for simultaneously selecting the target row and a row (or rows) shorted with the target row. In such alternative embodiments, predecoder 50 need not receive control bits from registers 40–42 (and need not process such control bits).

With reference again to the preferred embodiments, the manner in which controller 129 determines which control bits to load into registers 40, 41, and 42 and controls predecoder 50 will be explained in below in greater detail. In preferred implementations, each of registers 40, 41, and 42 has capacity to store one control bit. The control bits stored in registers 40, 41, and 42 are accessed by predecoder 50 (wherein they are processed to determine the selection and/or deselection bits output from predecoder 50 to decoder 12).

With reference again to interface 4 of FIG. 1, where the external device is a host processor having a standard DOS operating system with a PCMCIA-ATA interface (for communicating with a magnetic disk drive system), interface 4 preferably complies with the PCMCIA-ATA standard so that it can communicate with the standard PCMCIA-ATA interface of the external device.

In addition to row decoder circuit 12, system 30 includes column multiplexer (Y multiplexer) circuitry comprising: Y-decoder circuit 13; and one subset of Y Multiplexer circuitry for each main block of array 16 (e.g., circuit YMuxA for main block 16A, circuit YMuxB for main block 16B, and circuit YMuxJ for main block 16J).

Each of the cells of memory array circuit 16 is a storage location indexed by a row index (an "X" index determined by decoder circuit 12) and a column index (a "Y" index determined by Y decoder circuit 13). As described with reference to FIG. 2, each column of cells of array 16 can comprise "X+1" memory cells (where X is an integer), with each cell implemented by a single floating-gate N-channel transistor. Each flash memory cell is a nonvolatile memory cell since the transistor of each cell has a floating gate capable of semipermanent charge storage. The current drawn by each cell (i.e., by each of the N-channel transistors) depends on the amount of charge stored on the cell's floating gate. Thus, the charge stored on each floating gate determines a data value that is stored "semipermanently" in the corresponding cell. The charge stored on the floating gate of each flash memory cell is erasable (and thus the data value stored by each cell is erasable) by appropriately changing the voltage applied to the gate and source (in a well known manner). In memory systems comprising an array of non-volatile memory cells other than flash memory cells, such non-volatile cells are erased using other techniques which are well known.

As noted, system 30 emulates a conventional magnetic disk drive system. Accordingly, the cells of array 16 are addressed in a manner emulating the manner in which conventional magnetic disk storage locations are addressed. System 30 can be mounted on a card for insertion into a computer system (e.g., to replace a magnetic disk drive to which the computer system could store data). Alternatively, variations on system 30 (which lack array 16 and instead include a flash memory interface for interfacing with one or more separate memory array circuits) can be implemented as part of a card (for insertion into a computer system), where the card has a chip set mounted thereon, and the chip set includes a controller chip and several memory chips controlled by the controller chip. Each memory chip implements an array of flash memory cells.

Since system 30 of FIG. 1 emulates a magnetic disk drive, each set of above-mentioned address bits A(22:16), A(15:9) (or AL(15:9) or AR(15:9), and AX determines a cylinder, sector, and packet address of the type conventionally used in magnetic disk drive systems. In one implementation, array 16 of FIG. 1 has 544 bytes per row of flash memory cells (each byte consisting of eight bits, and each memory cell is capable of storing one bit). Each row of cells is equivalent to a magnetic disk "sector" (512 bytes of data plus 32 bytes of "overhead").

In such an implementation, array 16 is partitioned into a small number of large "main" blocks of cells (e.g., eight main blocks), with each main block comprising a number of erase blocks. The main blocks are preferably physically isolated from one another (e.g., there is no single bitline which extends through all the main blocks). In one such implementation, array 16 comprises 8192 wordlines and 34,816 bitlines and is partitioned into eight main blocks (with 1024 wordlines in each main block and 1024 cells connected along each bitline), no bitline extends through more than one main block, and a separate set of sense amplifiers is provided (within circuit 33 shown in FIG. 1) for reading each main block of cells (e.g., sixty-four sense amplifiers are provided within circuit 33, of which eight sense amplifiers are used to read eight cells of each main block in parallel, each cell connected along a different bitline). In the latter implementation, array 16 has capacity to store 32 Megabits of ordinary data (plus 2 Megabits of overhead data).

The partitioning of array 16 into erase blocks and isolated main blocks allows defects in one main (or erase) block to be isolated from the other blocks in the array, allows defective main (or erase) blocks to be bypassed by a controller, allows for high usage of die, and enhances overall yield of silicon produced (driving down the cost of flash mass storage systems).

In a class of preferred implementations, array 16 is partitioned into ten main blocks of cells (main blocks 16A–16J schematically indicated in FIG. 1). The main blocks are preferably physically isolated from one another. In one such preferred implementation, array 16 comprises 10,240 wordlines and 43,520 bitlines (with 1024 wordlines in each main block, and 1024 cells connected along each bitline), no single bitline extends through more than one main block, and a separate set of sense amplifiers is provided (within circuit 33) for reading each main block of cells (e.g., eighty sense amplifiers are provided, of which eight sense amplifiers are used to read eight cells of each main block in parallel, each cell connected along a different bitline). In this implementation, array 16 has capacity to store 40 Megabits of ordinary data (plus 2 and a half Megabits of overhead data). More specifically, array 16 of FIG. 1 includes ten main blocks (blocks 16A, 16B, 16C, 16D, 16E, 16F, 16G, 16H, 16I, and 16J, of which only blocks 16A, 16B, and 16H are shown in FIG. 1). Y-select gate circuitry YMuxA is provided for selecting columns of main block 16A in response to indices received from circuit 13, Y-select gate circuitry YMuxB is provided for selecting columns of main block 16B in response to indices received from circuit 13, Y-select gate circuitry YMuxJ is provided for selecting columns of main block 16J in response to indices received from circuit 13, and seven other subsets of Y-select gate circuitry (not separately shown) are provided for selecting columns of the other main blocks (blocks 16C, 16D, 16E, 16F, 16G, 16H, and 16I) in response to indices received from circuit 13.

Each main block is subdivided into a number of independently erasable blocks (preferably eight independently erasable blocks), sometimes referred to herein as "erase blocks." Each erase block consists of rows of flash memory cells, each row being capable of storing seventeen "packets" of binary bits, each packet consisting of 32 bytes (each byte consisting of eight binary bits). Preferably, each row (capable of storing 544 bytes) corresponds to one conventional disk sector (comprising 544 bytes), and each row can store 512 bytes of data of interest as well as 32 ECC bytes for use in error detection and correction (or 32 "overhead" bytes of some type other than ECC bytes, or a combination of ECC bytes and other overhead bytes).

Each erase block is divided into two blocks of cells known as "cylinders" of cells (in the sense that this expression is used in a conventional magnetic disk drive), with each cylinder consisting of 256K bits of data organized into 64 sectors (i.e. 64 rows of cells). Thus, each erase block in the preferred implementation of the FIG. 1 system consists of 128 sectors (i.e., 128 rows of cells).

Each erase block can be independently erased in response to signals from controller 129. All flash memory cells in each erase block are erased at the same (or substantially the same) time, so that erasure of an erase block amounts to erasure of a large portion of array 16 at a single time.

Each erase block can be independently erased in response to control signals supplied from controller 129 to circuits 12 and 13. All flash memory cells in each erase block are erased at the same (or substantially the same) time, so that erasure of an erase block amounts to erasure of a large portion of array 16 at a single time.

The individual cells of array 16 of FIG. 1 are addressed by address bits A(22:16), A(15:9) (or AL(15:9) or AR(15:9)), A(8:0), and AX. As noted, bits A(15:9) (or AL(15:9) or AR(15:9)) are for selecting a wordline (within a selected erase block). Since each erase block has 128 sectors (each sector corresponding to a row of cells connected along a single wordline) in the embodiment being described, a set of seven address bits A(15:9) determines any selected row in an erase block. In other words, such a seven-bit set A(15:9) determines either: any one of the 64 even-numbered wordlines driven by drivers 12A, or any one of the 64 odd-numbered wordlines driven by drivers 12B.

In the above-mentioned alternative embodiments, controller 129 is programmed to generate address bits AL(15:9) and AR(15:9) so that each set of fourteen bits AL(15:9) and AR(15:9) uniquely determines one of the 128 wordlines of an erase block (which are uniquely determined by a seven-bit set A(15:9) in the preferred embodiments). For example, the possible values of bits AL15 and AR15 map to the possible values of address A15, and the possible values of the twelve bits AL(14:9) and AR(14:9) map to the possible values of six-bit address A(14:9).

In the preferred embodiment described with reference to FIG. 1, the four highest order address bits (A22, A21, A20, and A19) determine the main block, the three next highest order address bits (A18, A17, and A16) determine the erase block, the address bit A15 determines the cylinder, the address bits A(14:9) determine the sector within the cylinder, the address bits A(8:5) and AX determine the packet (within the sector), and the five lowest order address bits (A4, A3, A2, A1, and A0) determine the byte within the packet. Address bits A(22:16) and A(15:9) are used by predecoder 50 to generate selection bits which are processed by circuit 12 to select the row (sector) of array 16 in which the target byte is located, and address bits A(8:0) and AX are used by predecoder 50 to generate selection bits which are processed by Y decoder circuit 13 to select the appropriate columns of array 16 in which the target byte is located.

Address bit AX is asserted by controller 129 to predecoder 50, and is used by predecoder 50 for selecting a packet consisting of overhead bits (such as ECC check bits and redundancy bits). More specifically, seventeen packets are stored per sector, including sixteen packets of ordinary data (any one of which can be selected by address bits A(8:5)) and one packet of overhead bits (which can be selected by address bit AX).

In operating modes in which cells in a single row of array 16 are accessed, system 30 executes a write operation as follows. Control engine 129 asserts appropriate ones of address bits A(22:16), A(15:9), A(8:0), and AX to predecoder 50, and the selection bits output by predecoder 50 are asserted to decoder circuits 12 and 13. The selection bits asserted to decoder 12 select a single wordline of array 16 (either an odd-numbered wordline or an even-numbered wordline). Control engine 129 also asserts appropriate control signals to other components of the system, including buffer 11 and circuits 12 and 13. In response to the selection bits, circuit 12 selects one sector (row) of cells and circuit 13 selects eight of the columns of memory cells of array 16. Address bits A(22:16), A(15:9), A(8:0), and AX thus together select a total of eight target cells in one selected row (for storing one byte of data). In response to a write command (a control signal) supplied from controller 129, a signal (indicative of an eight-bit byte of data) present at the output of input buffer 11 is asserted through the relevant Y multiplexer circuitry (e.g., through circuit YMuxJ, where the data is to be written to target cells in block 16J) to the eight target cells of array 16 determined by the row and column address (e.g., to the drain of each such cell). Depending on the value of each of the eight data bits, the corresponding target cell is either programmed or it remains in an erased state.

In operating modes in which cells in a single row of array 16 are accessed, system 30 executes a read operation as follows. Control engine 129 asserts address bits A(22:16), A(15:9), A(8:0), and AX to predecoder 50, and the selection bits output by predecoder 50 are asserted to circuits 12 and 13. Control engine 129 also asserts appropriate control signals to other components of the system, including circuits 12 and 13. In response to the selection bits, circuit 12 selects one row (sector) of cells, and circuit 13 selects eight of the columns of memory cells of array 16. Address bits A(22:16), A(15:9), A(8:0), and AX thus together determine a total of eight target cells in one selected row (for reading one byte of data). In response to a read command (a control signal) supplied from control unit 129, a current signal (a "data signal") indicative of a data value stored in one of the eight target cells of array 16 is supplied from the drain of each of the target cells through the bitline of the target cell and then through the relevant Y multiplexer circuitry (e.g., through circuit YMuxJ, where the data is stored in cells within block 16J) to sense amplifier circuitry 33. Each data signal is processed in sense amplifier circuitry 33, buffered in output buffer 10, and finally asserted through host interface 4 to an external device.

Circuits 12, 13, 33, and the described Y multiplexer circuitry (including the YMuxA, YMuxB, and YMuxJ circuitry) are sometimes referred to herein collectively as "array interface circuitry."

System 30 typically includes a pad (not shown) which receives a high voltage $V_{pp}$ from an external device, and a switch connected to this pad. During some steps of a typical erase or program sequence (in which cells of array 16 are erased or programmed), control unit 129 sends a control signal to the switch to cause the switch to close and thereby assert the high voltage $V_{pp}$ to various components of the system including wordline drivers within X decoder 12 (or the source line within array circuit 16).

When reading a selected cell of array 16, if the cell is in an erased state, the cell will conduct a first current which is converted to a first voltage in sense amplifier circuitry 33. If the cell is in a programmed state, it will conduct a second current which is converted to a second voltage in sense amplifier circuitry 33. Sense amplifier circuitry 33 determines the state of the cell (i.e., whether it is programmed or erased corresponding to a binary value of 0 or 1, respectively) by comparing the voltage indicative of the cell state to a reference voltage. The outcome of this comparison is an output which is either high or low (corresponding to a digital value of one or zero) which sense amplifier circuitry 33 sends to output buffer 10.

It is important during a write operation to provide the wordline of each selected cell with the proper voltage and the drain of each selected cell with the appropriate voltage level (the voltage determined by the output of input buffer 11), in order to successfully write data to the cell without damaging the cell.

Although X decoder 12 of FIG. 1 can be implemented in any conventional manner, we next describe a typical implementation of X decoder 12 with reference to FIGS. 3–6. An understanding of the FIG. 3–6 implementation of X decoder 12 will be helpful in appreciating the preferred embodiment of the inventive predecoder (to be described later with reference to FIGS. 7–12).

Figure 3:
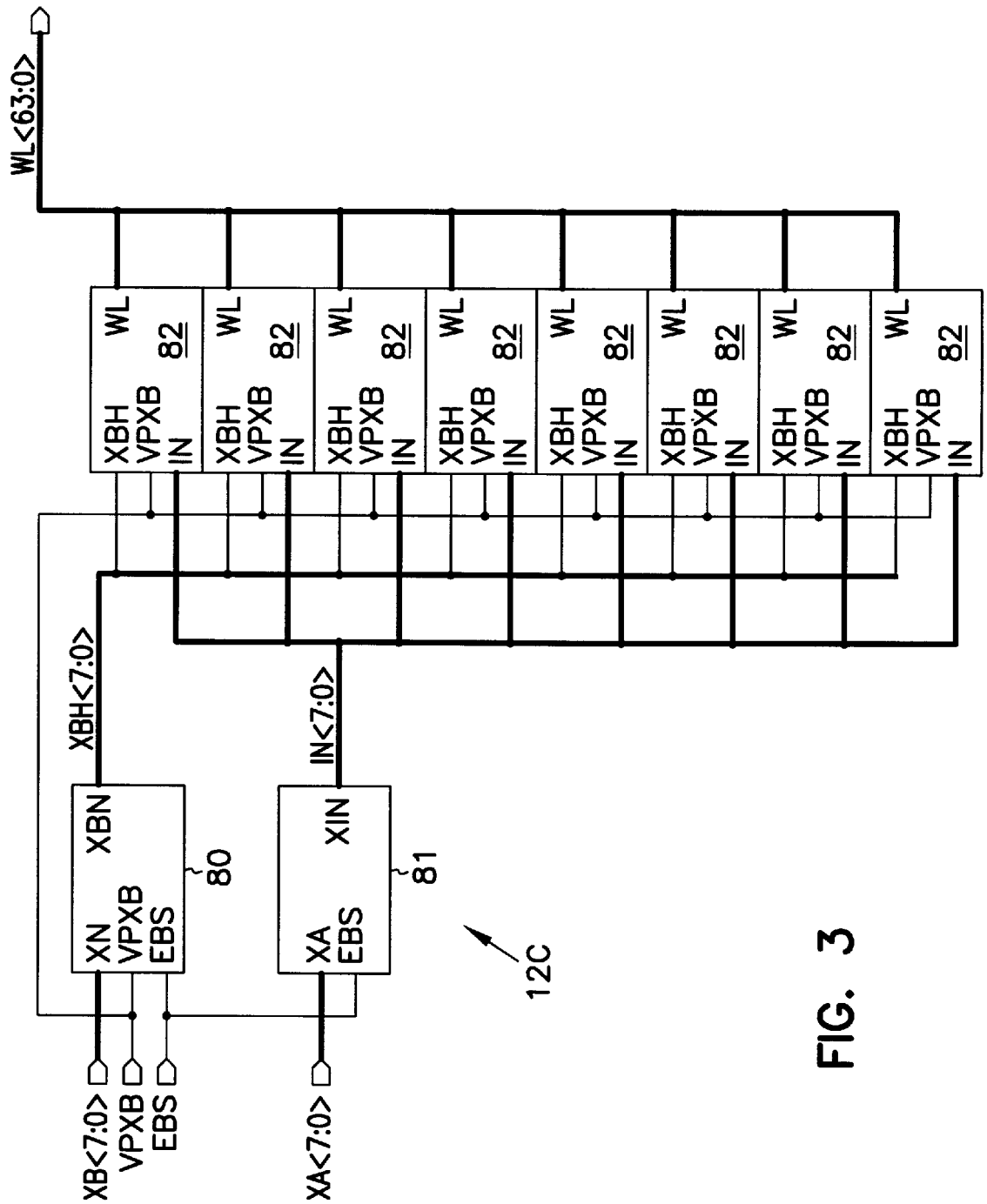
FIG. 3 is a block diagram of a portion of X-decoder circuit 12 of FIG. 1.

FIG. 3 is a block diagram of portion 12C of decoder circuit 12 of FIG. 1, and portion 12C is sometimes referred to herein as an erase block decoder. Erase block decoder 12C outputs a set of sixty-four control bits (decoded selection bits WL(63:0), each of which has either a high voltage level or a low voltage level), and each control bit can be applied directly to a different wordline within a single erase block of array 16. A control bit having the low voltage level (which is ground potential for system 30, in the preferred embodiment) is applied directly to each wordline within the erase block which is not selected.

Decoder 12 includes two identical circuits 12C for each erase block: one erase block decoder 12C whose outputs are connected to drivers "Dr" within above-described set 12A for the erase block; and another erase block decoder 12C whose outputs are connected to drivers "Dr" within above-described set 12B for the erase block. Each driver Dr is operable in a mode in which it asserts one of the output bits of circuit 12C directly to a wordline, and preferably each driver Dr is also operable in another mode in which it applies another voltage directly to the wordline. For example, each driver Dr preferably operates in response to an appropriate control signal to assert a negative voltage to the wordline, when a control bit from decoder 12C having the high (positive) voltage level is asserted to the driver. Such a negative voltage may be needed to erase the cells connected along the wordline, and the high (positive) voltage may be needed to read or program a cell or cells connected along the wordline.

A pair of the circuits 12C is needed to drive the wordlines of each erase block: one circuit 12C whose outputs are connected to wordline drivers within set 12A; and another circuit 12C whose outputs are connected to wordline drivers within set 12B. More specifically, drivers Dr (within set 12A) for the sixty-four even-numbered wordlines of an erase block receive decoded selection bits WL(63:0) from one erase block decoder 12C, and drivers Dr (within set 12B) for the sixty-four odd-numbered wordlines of the erase block receive a second set of decoded selection bits WL(63:0) from the other erase block decoder 12C. As shown in FIG. 3, each erase block decoder 12C receives selection bits XA(7:0) and XB(7:0), as well as high voltage VPXB, and enable signal EBS. For each decoder 12C connected to a driver within set 12A, the selection bits XA(7:0) and XB(7:0) respectively are bits XAL(7:0) and XBL(7:0) output from even-wordline predecoder 50L (to be described below with reference to FIG. 7). For each decoder 12C connected to a driver within set 12B, the selection bits XA(7:0) and XB(7:0) respectively are bits XAR(7:0) and XBR(7:0) output from odd-wordline predecoder 50R (to be described below with reference to FIG. 8).

With reference to FIG. 3, decoder 12C includes circuit 80 (which receives selection bits XB(7:0), high voltage VPXB, and enable signal EBS), circuit 81 (which receives selection bits XA(7:0) and enable signal EBS), and eight identical circuits 82 connected as shown. Each circuit 82 receives the eight bits IN(7:0) that are output from circuit 81, a different one of the eight bits XBH(7:0) that are output from circuit 80, and high voltage VPXB. In response, each circuit 82 outputs a different eight-bit subset of the sixty-four decoded selection bits WL(63:0). For example, the lowermost circuit 82 shown in FIG. 3 receives bit XBH7 from circuit 80 and bits IN(7:0) from circuit 81, and outputs the eight bits WL(63:58).

Consistent with the explanation above, we use the notation XA(7:0) to denote the following eight bits: $XA_7$, $XA_6$, $XA_5$, $XA_4$, $XA_3$, $XA_2$, $XA_1$, and $XA_0$. Thus, XAL(7:0) denotes the bits $XAL_7$, $XAL_6$, $XAL_5$, $XAL_4$, $XAL_3$, $XAL_2$, $XAL_1$, and $XAL_0$, XBR(7:0) denotes the bits $XBR_7$, $XBR_6$, $XBR_5$, $XBR_4$, $XBR_3$, $XBR_2$, $XBR_1$, and $XBR_0$, and so on.

Decoder 12C performs the following decoding operation on selection bits XAL(7:0), XBL(7:0), XAR(7:0), and XBR(7:0):

each pair of bits $XAL_i$, $XBL_0$ corresponds to one of the first eight even-numbered wordlines in an erase block, with $XAL_0$, $XBL_0$ corresponding to the first even-numbered wordline, $XAL_1$, $XBL_0$ corresponding to the second even-numbered wordline, and so on;

each pair of bits $XAL_i$, $XBL_1$ corresponds to one of the next eight even-numbered wordlines in the erase block, with $XAL_0$, $XBL_1$ corresponding to the ninth even-numbered wordline, $XAL_1$, $XBL_0$ corresponding to the tenth even-numbered wordline, and so on;

each pair of bits $XAL_i$, $XBL_j$ corresponds to one of the "j+1"th set of eight even-numbered wordlines in the erase block, with $XAL_0$, $XBL_j$ corresponding to the first even-numbered wordline in the "j+1"th set, $XAL_1$, $XBL_0$ corresponding to the second even-numbered wordline in the "j+1"th set, and so on;

each pair of bits $XAR_i$, $XBR_0$ corresponds to one of the first eight odd-numbered wordlines in the erase block, with $XAR_0$, $XBR_0$ corresponding to the first odd-numbered wordline, $XAR_1$, $XBR_0$ corresponding to the second odd-numbered wordline, and so on;

each pair of bits $XAR_i$, $XBR_1$ corresponds to one of the next eight odd-numbered wordlines in the erase block, with $XAR_0$, $XBR_1$ corresponding to the ninth odd-numbered wordline, $XAR_1$, $XBR_0$ corresponding to the tenth odd-numbered wordline, and so on;

each pair of bits $XAR_i$, $XBR_j$ corresponds to one of the "j+1"th set of eight odd-numbered wordlines in the erase block, with $XAR_0$, $XBR_j$ corresponding to the first odd-numbered wordline in the "j+1"th set, $XAR_1$, $XBR_0$ corresponding to the second odd-numbered wordline in the "j+1"th set, and so on;

in response to each pair of bits $XAL_i$, $XBL_j$ (or bits $XAR_i$, $XBR_j$) having the binary values 1,1, decoder 12C asserts the corresponding one of output bits WL(63:0) with a "high" voltage level substantially equal to VPXB; and in response to each pair of bits $XAL_i$, $XBL_j$ (or bits $XAR_i$, $XBR_j$) having the binary values 0,1 (or 1,0, or 0,0), decoder 12C asserts the corresponding one of output bits WL(63:0) with a "low" voltage level substantially equal to ground potential.

For example, in response to a set of selection bits $XAL_0$=1, $XAL_1$=$XAL_2$=$XAL_3$=$XAL_4$=$XAL_5$=$XAL_6$=$XAL_7$=0, and $XBL_0$1, $XBL_1$=$XBL_2$=$XBL_3$=$XBL_4$=$XBL_5$=$XBL_6$=$XBL_7$=0, decoder 12C (connected to drivers within set 12A) asserts only bit WL(0) with a high voltage level VPXB (thus selecting only the first even-numbered wordline in the erase block).

For another example, in response to a set of selection bits $XAR_0$=1, $XAR_1$=$XAR_2$=$XAR_3$=$XAR_4$=$XAR_5$=$XAR_6$=$XAR_7$=0, and $XBR_0$=1, $XBR_1$=$XBR_2$=$XBR_3$=$XBR_4$=$XBR_5$=$XBR_6$=$XBR_7$=0, decoder 12C (connected to drivers within set 12B) asserts only bit WL(0) with a high voltage level VPXB (thus selecting only the first odd-numbered wordline in the erase block).

For another example, in response to a set of selection bits $XAL_6$=1, $XAL_0$=$XAL_1$=$XAL_2$=$XAL_3$=$XAL_4$=$XAL_5$=$XAL_7$=0, and $XBL_0$=1, $XBL_1$=$XBL_2$=$XBL_3$=$XBL_4$=$XBL_5$=$XBL_6$=$XBL_7$=0, decoder 12C (connected to drivers within set 12A) asserts only bit WL(6) with a high voltage level VPXB (thus selecting only the seventh even-numbered wordline in the erase block).

For another example, in response to a set of selection bits $XAR_0$=$XAR_1$=$XAR_2$=$XAR_3$=$XAR_4$=$XAR_5$=$XAR_6$=$XAR_7$=0, and $XBR_0$=1, $XBR_1$=$XBR_2$=$XBR_3$=$XBR_4$=$XBR_5$=$XBR_6$=$XBR_7$=0, decoder 12C (connected to drivers within set 12B) asserts all of bits WL(63:0) with a low voltage level (thus selecting none of the odd-numbered wordlines in the erase block).

Figure 4:
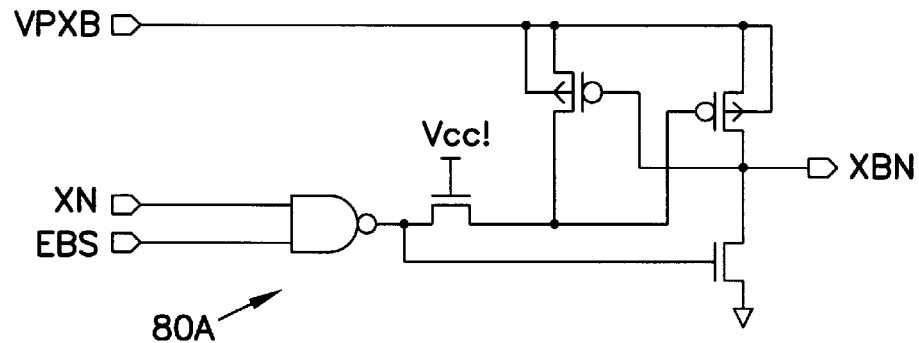
FIG. 4 is a schematic diagram of a portion of circuit 80 of FIG. 3.

With reference to FIGS. 3 and 4, circuit 80 includes eight circuits identical to circuit 80A shown in FIG. 4. Each circuit 80A receives a different one (denoted as "XN" in FIG. 4) of the eight selection bits XB(7:0), and also receives enable bit EBS and voltage signal VPXB. In response to bit EBS having a logical value "0" (e.g., when circuit 80A is not enabled), the two N-channel MOS transistors in circuit 80A are "on," so that circuit 80A's output bit "XBH" is a low voltage (substantially equal to ground potential for the system). In response to bit EBS having a logical value "1" (e.g., when EBS is high, and circuit 80A is enabled), the output of the NAND gate in circuit 80A is the inverse of the input bit XN, so that circuit 80A's output bit "XBH" is a low voltage (substantially equal to ground potential) when XN is low (substantially equal to ground potential), and circuit 80A's output bit "XBH" is substantially equal to high voltage VPXB (i.e., the logical value of XBH is "1") when XN is high. For example, when EBS is high, the circuits 80A output the bits XBH0=1, XBH1=XBH2=XBH3=XBH4=XBH5=XBH6=XBH7=0, in response to selection bits XB0=1, XB1=0, XB2=0, XB3=0, XB4=0, XB5=0, XB6=0, and XB7=0, respectively.

Figure 5:
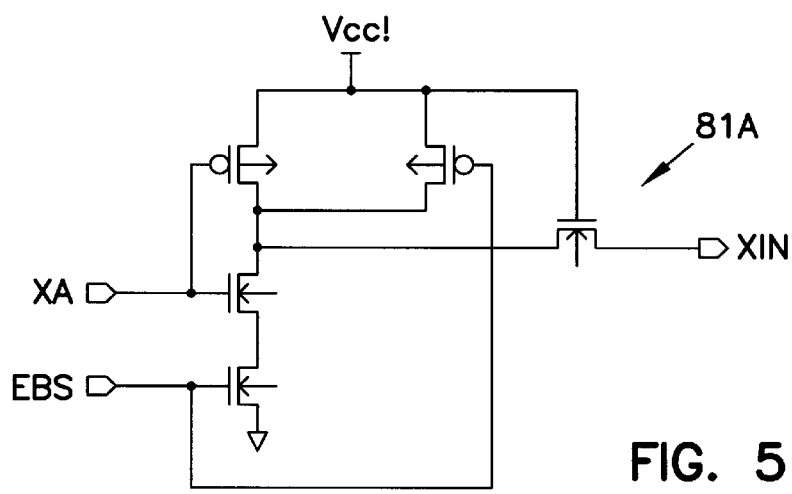
FIG. 5 is a schematic diagram of a portion of circuit 81 of FIG. 3.

With reference to FIGS. 3 and 5, circuit 81 includes eight circuits identical to circuit 81A shown in FIG. 5. Each circuit 81A comprises three NMOS transistors and two PMOS transistors (connected as shown in FIG. 5), receives a different one (denoted as "XA" in FIG. 5) of the eight selection bits XA(7:0), and also receives enable bit EBS. In response to bit EBS having a logical value "0" (e.g., when circuit 81A is not enabled), circuit 81A's output bit "XIN" has a logical value "1" (its level is substantially equal to supply voltage Vcc). In response to bit EBS having a logical value "1" (e.g., when circuit 81A is enabled), circuit 80A's output bit "XIN" is a low voltage (substantially equal to ground potential) when XA is high, and circuit 81A's output bit "XIN" is high (substantially equal to Vcc) when XA is low. For example, when EBS is high, the circuits 81A output the bits IN0=0, IN1=IN2=IN3=IN4=IN5=IN6=IN7=1, in response to selection bits XA0=1, XA1=0, XA2=0, XA3=0, XA4=0, XA5=0, XA6=0, and XA7=0, respectively.

Figure 6:
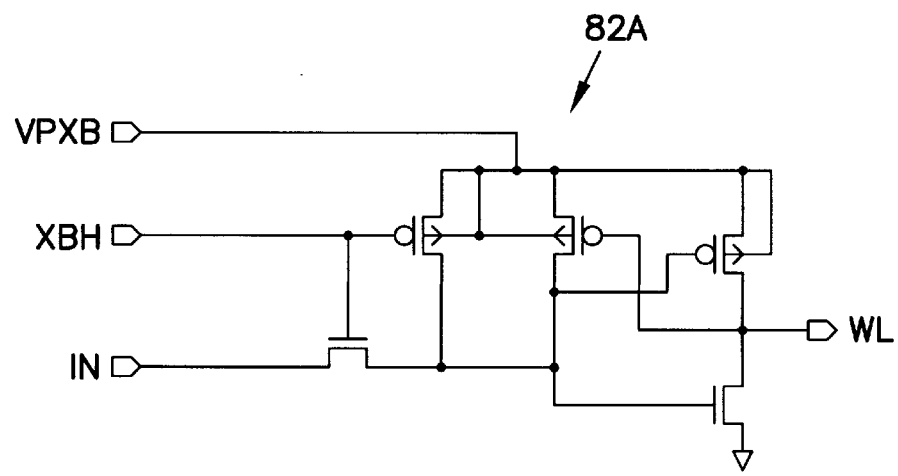
FIG. 6 is a schematic diagram of a portion of one of circuits 82 of FIG. 3.

With reference to FIGS. 3 and 6, each circuit 82 includes eight circuits identical to circuit 82A shown in FIG. 6. Each circuit 82A comprises two NMOS transistors and three PMOS transistors (connected as shown in FIG. 6). In the "n"th circuit 82 from the top of FIG. 3 (where circuit 82 at the top of FIG. 3 corresponds to n=0, the next circuit 82 from the top of FIG. 3 corresponds to n=1, and so on), each circuit 82A receives bit XBHn (denoted as "XBH" in FIG. 6), and receives a different one (denoted as "IN") of the eight bits IN(7:0) output from circuit 81, and also receives high voltage signal VPXB. Each circuit 82A outputs a different one of bits WL(63:0) (which is denoted as "WL" in FIG. 6). In response to bit XBH having a logical value "0" (e.g., when its level is substantially equal to ground potential), circuit 82A's output bit "WL" also has a logical value "0." In response to bit XBH having a logical value "1" (e.g., when the level of XBH is substantially equal to VPXB), circuit 82A's output bit "WL" is a low voltage (substantially equal to ground potential) when IN is high, and output bit "WL" is high (substantially equal to VPXB) when IN is low. For example, circuits 82A in the top circuit 82 in FIG. 3 output the bits WL0=1 and WL1=WL2=WL3=WL4=WL5= WL6=WL7=0, and circuits 82A in the next circuit 82 from the top of FIG. 3 output the bits WL8=WL9=WL10=WL11= WL12=WL13=WL14=WL15=0, in response to bits XBH0= 1, XBH1=0, IN0=0, and IN1=IN2=IN3=IN4=IN5=IN6= IN7=1.

In accordance with the invention, predecoder 50 operates in a first mode in which it supplies bits XBL(7:0), XAL(7:0), XBR(7:0), and XAR(7:0) to the pair of decoders 12C connected to the wordline drivers of a selected erase block, with values which cause the pair of decoders 12C to simultaneously select at least two shorted-together wordlines of the erase block (by asserting corresponding ones of the bits WL with the high level VPXB) and which cause the decoders 12C to deselect all other wordlines of the erase block (by asserting all others of the bits WL with a low level).

Preferably, predecoder 50 is also operable in any selected one of the following modes (at times when it is not operating in the first mode):

a second mode in which it supplies bits XBL(7:0), XAL(7:0), XBR(7:0), and XAR(7:0) to the pair of decoders 12C connected to the wordline drivers of a single erase block, with values which cause the decoder pair 12C to select a single wordline of the erase block);

a third mode in which it supplies bits XBL(7:0), XAL(7:0), XBR(7:0), and XAR(7:0) to the pair of decoders 12C connected to the wordline drivers of a single erase block, with values which cause the decoder pair 12C to select all the wordlines of the erase block); and a fourth mode in which it supplies bits XBL(7:0), XAL(7:0), XBR(7:0), and XAR(7:0) to the pair of decoders 12C connected to the wordline drivers of a single erase block, with values which cause the decoder pair 12C to deselect all wordlines of the erase block.

Next, with reference to FIGS. 7-12, we describe a preferred embodiment of predecoder 50 of FIG. 1. In this embodiment, predecoder 50 includes even-wordline predecoder 50L (shown in FIG. 7), odd-wordline predecoder 50R (shown in FIG. 8), and conventional circuitry (denoted herein as "block and bitline" predecoding circuitry) for predecoding address bits (i.e., address bits A(22:16)) which determine a main block and erase block of array 16 and address bits (i.e., address bits A(8:0) and AX) which determine one or more cells connected along each selected wordline of array 16. The conventional block and bitline predecoding circuitry asserts selection bits to decoder 12 (for selecting the main block and erase block), and asserts selection bits to Y-decoder 13 (for selecting a cell or cells connected along each selected wordline). Since the block and bitline predecoding circuitry within predecoder 50 (which processes address bits A(22:16), A(8:0) and AX received from controller 129) is conventional, it will not be described in greater detail. Rather, what next follows is a description of circuitry 50L and 50R within predecoder 50 (which processes address bits A(15:9) received from controller 129).

As noted above, controller 129 preferably generates and asserts to predecoder 50 one set of internal address bits A(15:9) for use in selecting one or more wordlines. In modes of operation in which the system simultaneously selects multiple, shorted-together rows of array 16, address bits A(15:9) select at least two adjacent wordlines within a single erase block (typically, one even-numbered wordline and the odd-numbered wordline adjacent thereto).

The following description of the preferred embodiments of circuits 50L and 50R assumes that the same set of address bits A(15:9) (and their inverses A_(15:9)) is supplied to each of circuits 50L and 50R.

In these preferred embodiments, controller 129 loads control bits (denoted as C1, C2, and C3 in FIG. 1) into registers 40, 41, and 42, in addition to asserting address bits A(15:9) to circuits 50L and 50R. Circuit 50L receives control bits C1 and C2, and these control bits determine the mode of operation of circuit 50L in a manner to be explained below. Circuit 50R receives control bits C1 and C3, and these control bits determine the mode of operation of circuit 50R in a manner to be explained below.

Controller 129 is programmed with data indicative of each pair of wordlines of array 16 that have been determined to be shorted together, and is programmed to generate (and load into registers 40–42) the control bits C1–C3 for use by circuits 50L and 50R during generation of multi-row selection bits for simultaneously selecting shorted-together rows.

Controller 129, in response to command bits and buffered address bits indicating an access of a target row (or one or more cells in such target row) which is shorted with another row, asserts to predecoder 50 address bits A(15:9) and control bits WLSHIGH and WLow_ (indicated in FIGS. 7 and 8), and ensures that appropriate control bits C1–C3 have been loaded into registers 40–42, to cause circuits 50L and 50R within predecoder 50 to assert multi-row selection bits for simultaneously selecting the target row and all rows shorted with the target row. In this mode, control bit WLSHIGH is low (representing a logical "0") and WLow_ is high (representing a logical "1").

Figure 7:
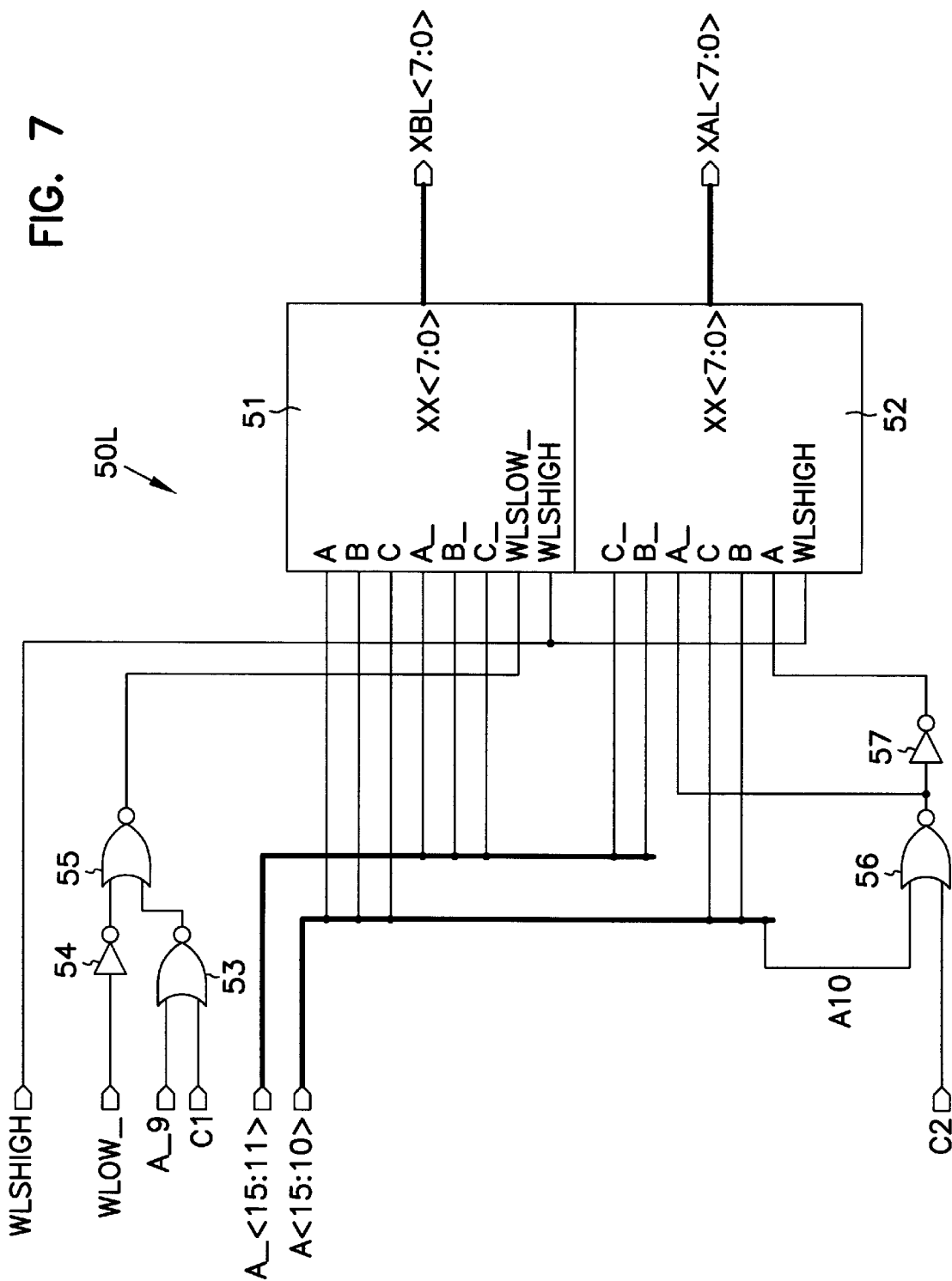
FIG. 7 is a diagram of a first portion.

As shown in FIG. 7, circuit 50L includes:

inverter 54 which inverts bit WLow_;

NOR gate 53 whose inputs receive control bit C1 and inverted address bit A9 (denoted as "A_9");

NOR gate 55 whose inputs receive the output of gate 53 and the output of inverter 54;

NOR gate 56 whose inputs receive control bit C2 and address bit A10;

inverter 57 which inverts the output of gate 56;

circuit 51 which receives address bits A(15:13) and their inverses (denoted as "A_ (15:13)"), the output of gate 55 (denoted as WLSLOW_), and bit WLSHIGH; and circuit 52 which receives address bits A(12:11) and their inverses (denoted as "A_ (12:11)"), the output of gate 56 (denoted as "A_"), the output of inverter 57 (denoted as "A"), and bit WLSHIGH.

In response, circuit 51 asserts above-discussed selection bits XBL(7:0) to circuit 12, and circuit 52 asserts above-discussed selection bits XAL(7:0) to circuit 12.

Figure 8:
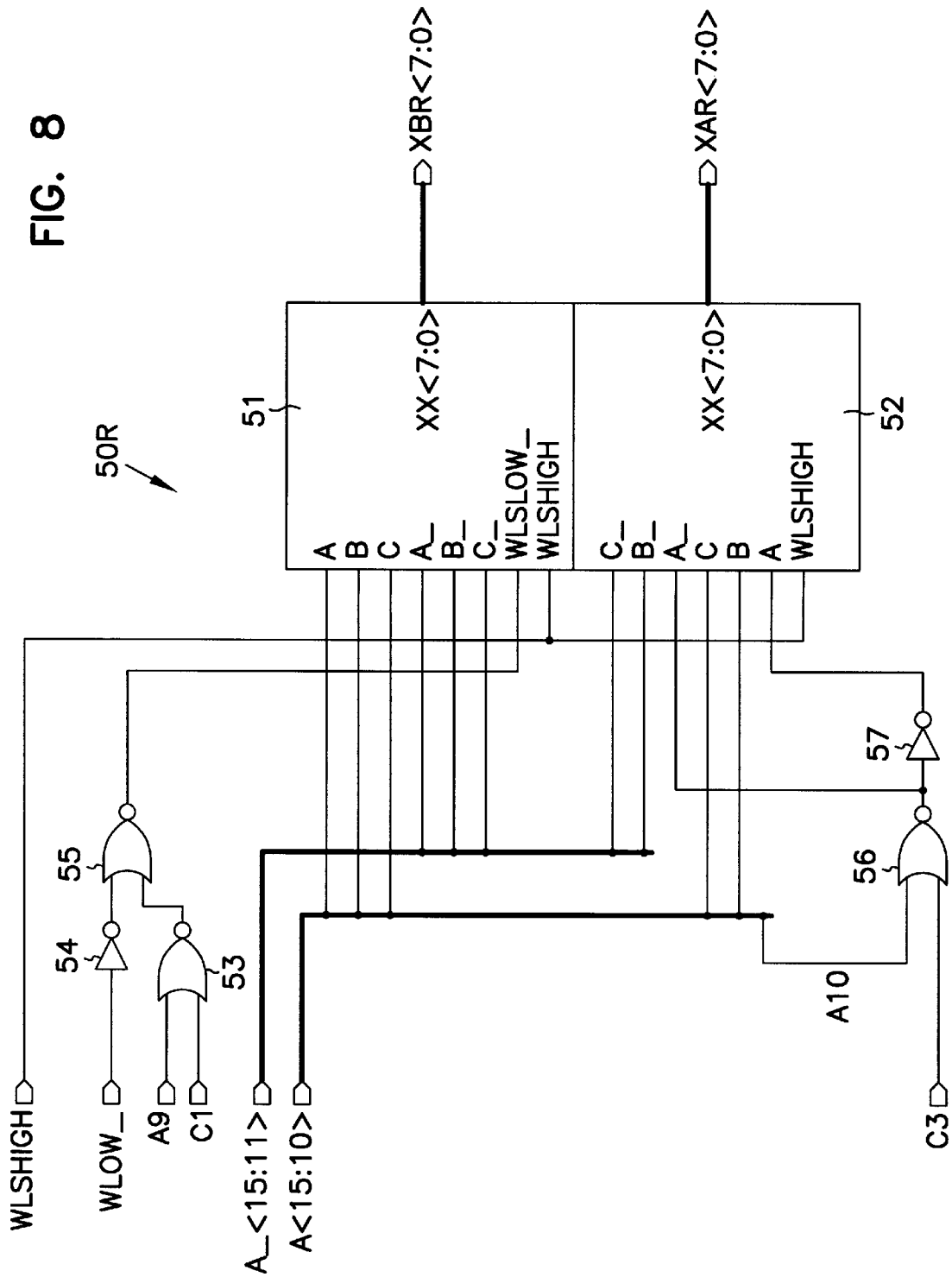
FIG. 8 is a diagram of a second portion, of a preferred embodiment of predecoder circuit 50 of FIG. 1.

Circuit 50R has structure which is identical to that of circuit 50L, but receives a different set of bits. As shown in FIG. 8, circuit SOR includes:

inverter 54 which inverts bit WLow_;

NOR gate 53 whose inputs receive control bit C1 and address bit A9;

NOR gate 55 whose inputs receive the output of gate 53 and the output of inverter 54;

NOR gate 56 whose inputs receive control bit C3 and address bit A10;

inverter 57 which inverts the output of gate 56;

circuit 51 which receives address bits A(15:13) and their inverses (denoted as "A_(15:13)"), the output of gate 55 (denoted as WLSLOW_), and bit WLSHIGH; and circuit 52 which receives address bits A(12:11) and their inverses (denoted as "A_(12:11)"), the output of gate 56 (denoted as "A_"), the output of inverter 57 (denoted as "A"), and bit WLSHIGH.

In response, circuit 52 asserts above-discussed selection bits XBR(7:0) to circuit 12, and circuit 52 asserts above-discussed selection bits XAR(7:0) to circuit 12.

As noted above, in alternative embodiments, controller 129 generates and asserts to predecoder 50 two sets of internal address bits, AL(15:9) and AR(15:9), of which address bits AL(15:9) are used for selecting one or more even-numbered wordlines (driven by wordline driver set 12A) and address bits AR(15:9) are used for selecting one or more odd-numbered wordlines (driven by wordline driver set 12B). In modes of operation in which the system simultaneously selects multiple, shorted-together rows of array 16, address bits AL(15:9) and AR(15:9) select at least two adjacent wordlines within a single erase block (typically, one even-numbered wordline and the odd-numbered wordline adjacent thereto).

In some such alternative embodiments, predecoder 50 of the inventive memory system includes circuit 150L (shown in FIG. 13) and circuit 150R (shown in FIG. 14) rather than circuits 50L and 50R shown in FIGS. 7 and 8 (but is otherwise identical to the above-mentioned preferred embodiment of predecoder 50). Address bits AL(15:9) are supplied to circuit 150L and address bits AR(15:9) are supplied to circuit 150R.

Controller 129 is programmed with data indicative of each pair of wordlines of array 16 that have been determined to be shorted together, and is programmed to generate address bits AL(15:9) and AR (15:9) as follows. When the target wordline an even-numbered wordlines of array 16 (and an adjacent, odd-numbered wordline is shorted with the target wordline), bits AL(15:9) and AR(10:9) determine the target wordline and the wordline shorted with it. When the target wordline is an odd-numbered wordline of array 16 (and an adjacent, even-numbered wordline is shorted with the target wordline), bits AR(15:9) and AL(10:9) determine the target wordline and the wordline shorted with it.

Controller 129, in response to command bits and buffered address bits indicating an access of a target row (or one or more cells in such target row) which is shorted with another row, asserts to the predecoder the address bits AL(15:9) and AR(15:9) and the control bits WLSHIGH and WLow_ (indicated in FIGS. 13 and 14), to cause circuits 150L and 150R within the predecoder to assert multi-row selection bits for simultaneously selecting the target row and a row shorted with the target row. In this mode, control bit WLSHIGH is low (representing a logical "0") and WLow_ is high (representing a logical "1").

Figure 13:
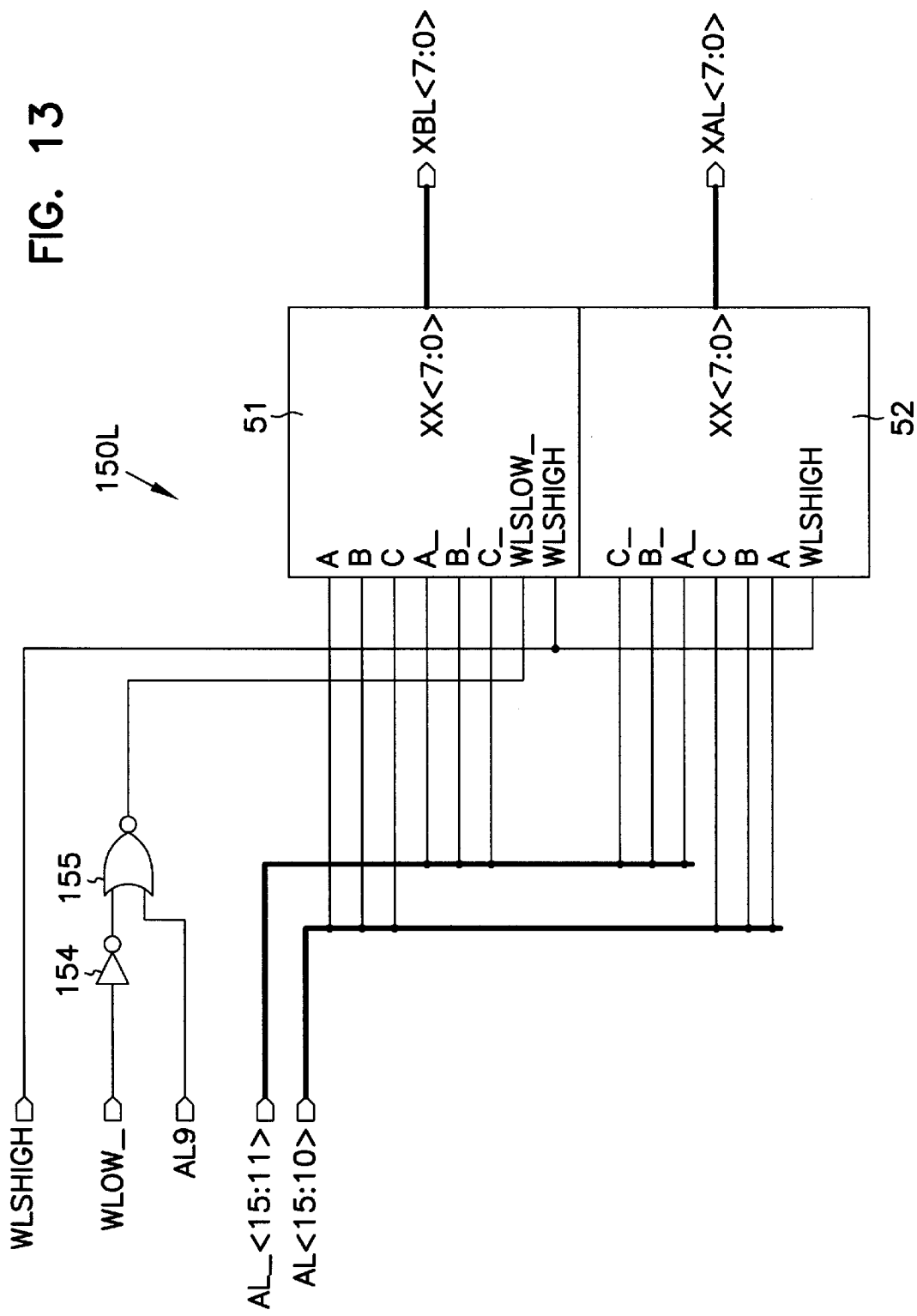
FIG. 13 is a diagram of a first portion.

As shown in FIG. 13, circuit 150L includes:

inverter 154 which inverts bit WLow_;

NOR gate 155 whose inputs receive bit AL9 the output of inverter 154;

circuit 51 which receives address bits AL(15:13) and their inverses (denoted as "AL_ (15:13)"), the output of gate 155 (denoted as WLSLOW_), and bit WLSHIGH; and circuit 52 which receives address bits AL(12:10) and their inverses (denoted as "AL_(12:10)"), and bit WLSHIGH.

In response, circuit 51 (of circuit 150L) asserts selection bits XBL(7:0) to circuit 12 (the same selection bits XBL (7:0) discussed above with reference to circuit 50L of FIG. 7), and circuit 52 (of circuit 1SOL) asserts selection bits XAL(7:0) to circuit 12 (the same selection bits XAL(7:0) discussed above with reference to circuit 50L of FIG. 7).

Figure 14:
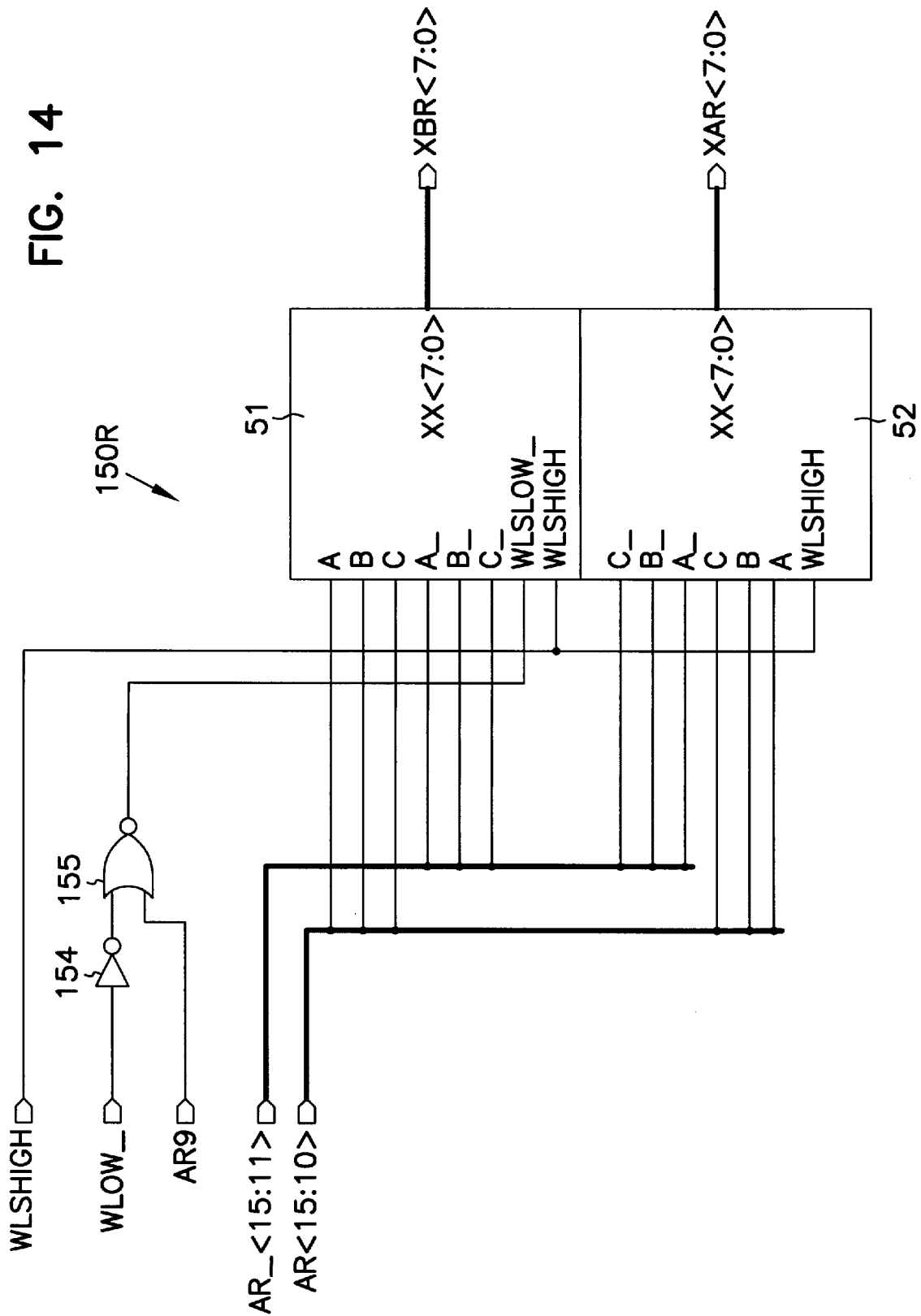
FIG. 14 is a diagram of a second portion, of an alternative embodiment of predecoder circuit 50 (of FIG. 1) which does not receive control bits C1, C2, and C3.

Circuit 150R has structure which is identical to that of circuit 150L, but receives a different set of bits. As shown in FIG. 14, circuit 150R includes:

inverter 154 which inverts bit WLow_;

NOR gate 155 whose inputs receive address bit AR9 and the output of inverter 154;

circuit 51 which receives address bits AR(15:13) and their inverses (denoted as "AR_(15:13)"), the output of gate 155 (denoted as WLSLOW_), and bit WLSHIGH; and circuit 52 which receives address bits AR(12:10) and their inverses (denoted as "AR_(12:10)"), and bit WLSHIGH.

In response, circuit 52 of circuit 15OR asserts selection bits XBR(7:0) to circuit 12 (the same selection bits XBR (7:0) discussed above with reference to circuit 50R of FIG. 8), and circuit 52 of circuit 150R asserts selection bits XAR(7:0) to circuit 12 (the same selection bits XAR(7:0) discussed above with reference to circuit 50R of FIG. 8).

In some modes of operation of a memory system whose predecoder 50 includes circuits 150L and 150R, the circuits 150L and 150R assert multi-row selection bits for simultaneously selecting a target row of cells (a target wordline) and all rows shorted with the target row (all rows connected along wordlines shorted with the target wordline), control bit WLSHIGH is low (representing a logical "0") and control bit WLow_ is high (representing a logical "1").

In other modes of operation of such a memory system (whose predecoder 50 includes circuits 150L and 150R), the controller asserts bits WLow_ and WLSHIGH with other values. In one such other mode, predecoder 50 asserts multirow selection bits for causing decoder 12 to select all wordlines of an erase block (in response to assertion of bit WLSHIGH with a high level). In this mode, the controller asserts WLSHIGH with a high level (a logical "1"), and in response, the output of each circuit 61 and 62 (within each of circuits 51 and 52 within circuits 150L and 150R) is low.

Thus, each of selection bits XAR(7:0), XAL(7:0), XBR(7:0), and XBL(7:0) is high (a logical "1").

In another such mode, predecoder 50 asserts selection bits for causing decoder 12 to deselect all wordlines of an erase block (in response to assertion of bit WLow__ with a low level, and bit WLSHIGH with a low level). In this mode, the controller asserts WLow__ with a low level (a logical "0"), and in response, the output of NOR gate 55 (the bit "WLSLOW__") is low (a logical "0"). In response to the low value of bit WLSLOW__ (and the low value of bit WLSHIGH), the output of each circuit 61 (within each of circuits 51) is high. Thus, each of selection bits XBR(7:0) and XBL(7:0) is low (a logical "0"). In response to such values of bits XBR(7:0) and XBL(7:0), decoder 12 will deselect all wordlines of the erase block (regardless of the values of XAR(7:0) and XAL(7:0)).

Figure 9:
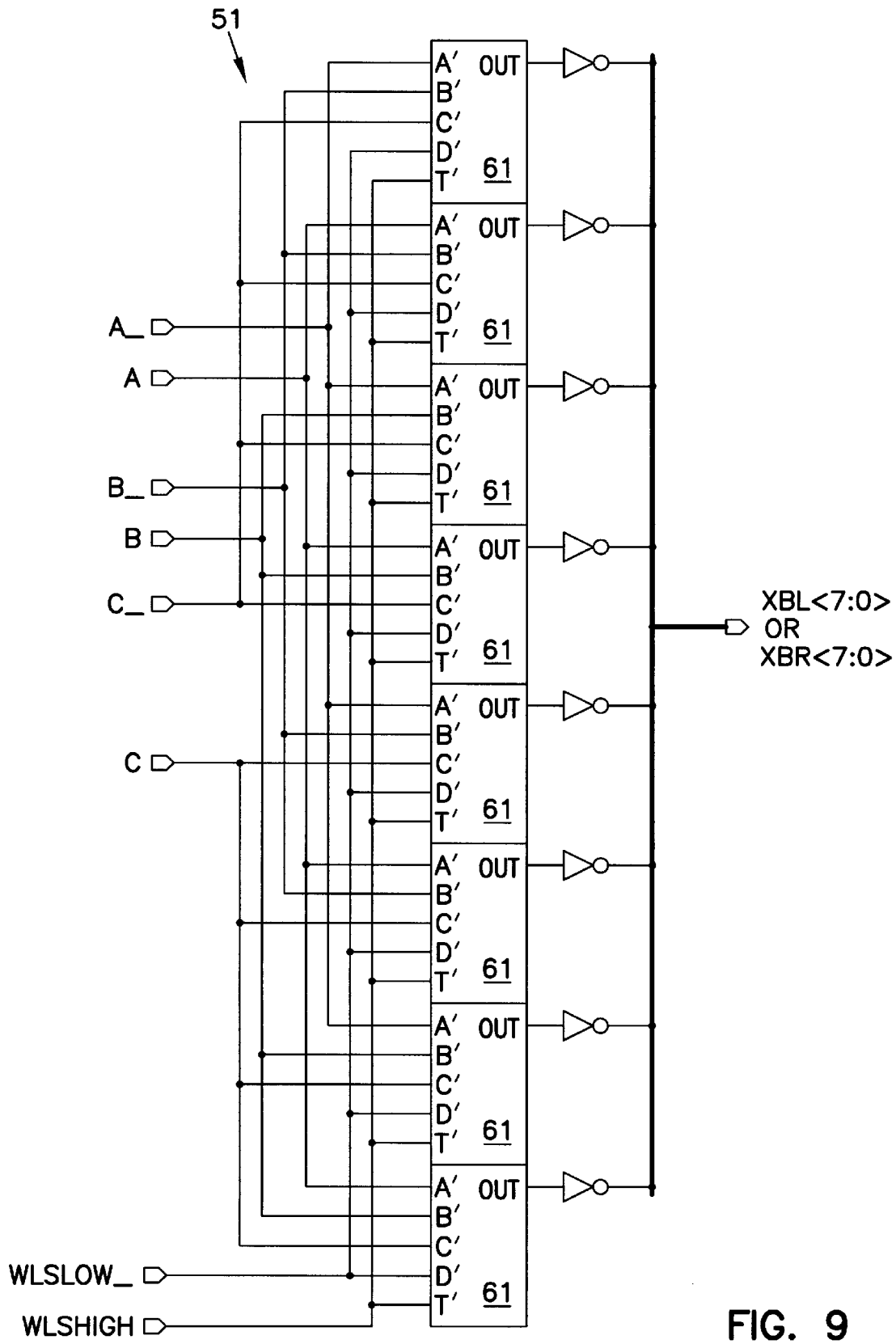
FIG. 9 is a block diagram of circuit 51 of FIG. 7 (or FIG. 8).
Figure 11:
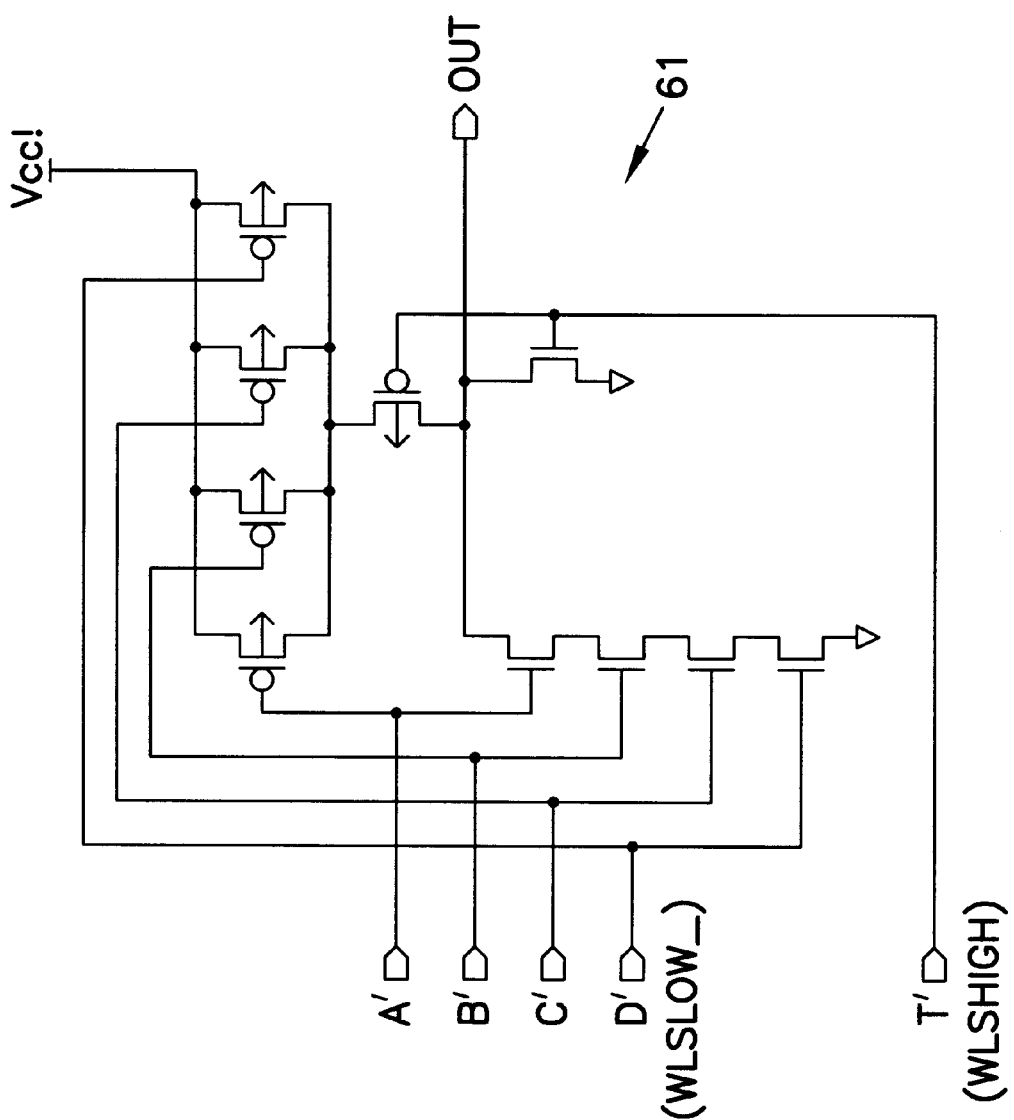
FIG. 11 is a schematic diagram of one of circuits 61 of FIG. 9.

FIG. 9 is a block diagram of circuit 51 of FIG. 7 (or any of FIGS. 8, 13, and 14). As shown in FIG. 9, circuit 51 comprises eight identical circuits 61. Each circuit 61 (whose preferred structure is shown in FIG. 11) has five inputs, of which the inputs labeled A', B', and C' receive address bits, the input labeled D' receives bit WLSLOW__, and the input labeled T' receives bit WLSHIGH. Each circuit 61 receives a different set of address bits at its A', B', and C' inputs, and outputs the inverse of one of bits XBL(7:0) (or the inverse of one of bits XBR(7:0). Specifically, circuits 61 within circuit 50L or 150L (in order from the top to the bottom of FIG. 9) receive the following address bits at their inputs A', B', and C' and their inverted outputs are as follows:

| A' | B' | C' | Inverted Output |
|---|---|---|---|
| A__13 | A__14 | A__15 | XBL0 |
| A13 | A__14 | A__15 | XBL1 |
| A__13 | A14 | A__15 | XBL2 |
| A13 | A14 | A__15 | XBL3 |
| A__13 | A__14 | A15 | XBL4 |
| A13 | A__14 | A15 | XBL5 |
| A__13 | A14 | A15 | XBL6 |
| A13 | A14 | A15 | XBL7 |

It should be understood that when circuit 51 is implemented in the FIG. 13 circuit, the values A15, A14, and A13 in the above table denote bits AL15, AL14, and AL13.

Circuits 61 within circuit 50R or 150R (in order from the top to the bottom of FIG. 9) receive the following address bits at their inputs A', B', and C' and their inverted outputs are as follows:

| A' | B' | C' | Inverted Output |
|---|---|---|---|
| A__13 | A__14 | A__15 | XBR0 |
| A13 | A__14 | A__15 | XBR1 |
| A__13 | A14 | A__15 | XBR2 |
| A13 | A14 | A__15 | XBR3 |
| A__13 | A__14 | A15 | XBR4 |
| A13 | A__14 | A15 | XBR5 |
| A__13 | A14 | A15 | XBR6 |
| A13 | A14 | A15 | XBR7 |

It should be understood that when circuit 51 is implemented in the FIG. 14 circuit, the values A15, A14, and A13 in the above table denote bits AR15, AR14, and AR13.

Figure 10:
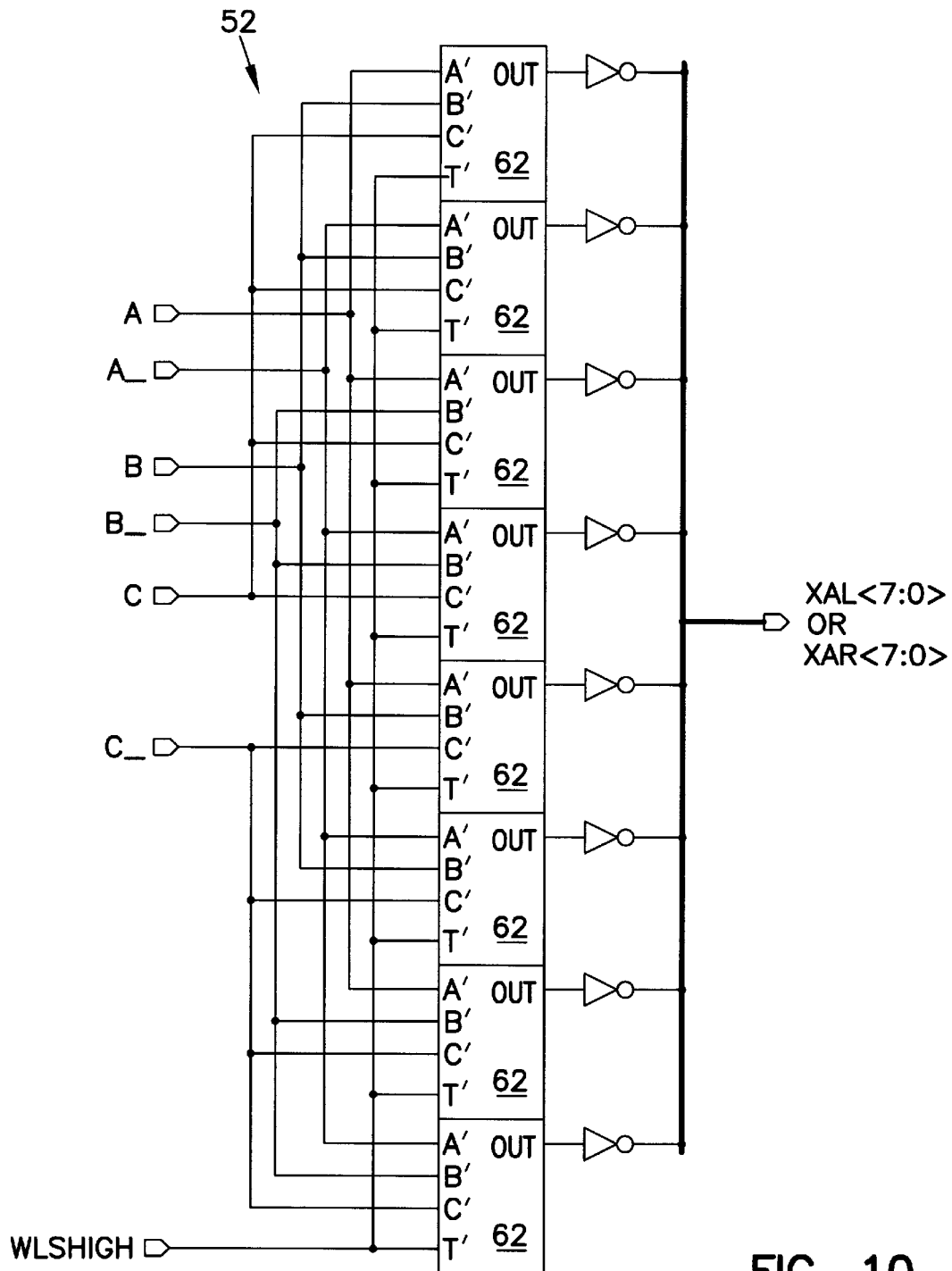
FIG. 10 is a block diagram of circuit 52 of FIG. 7 (or FIG. 8).
Figure 12:
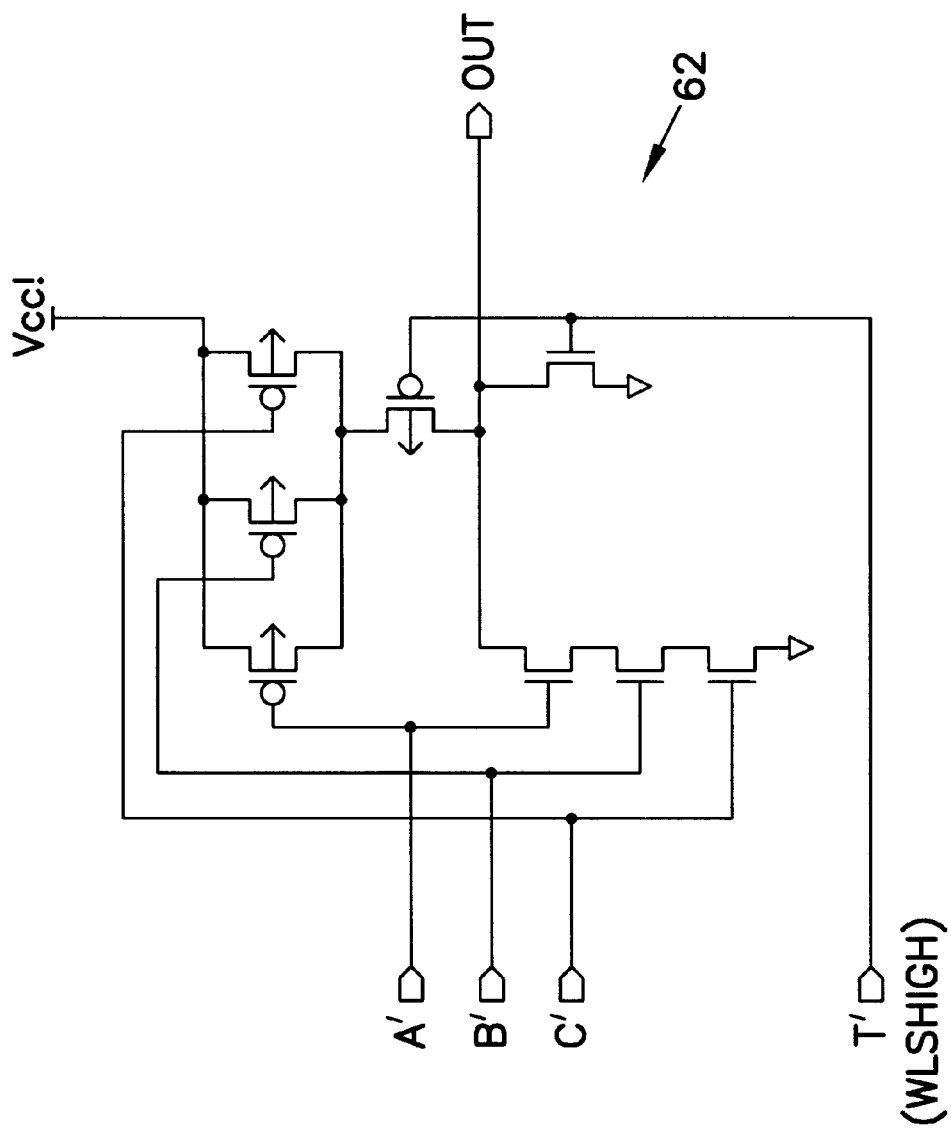
FIG. 12 is a schematic diagram of one of circuits 62 of FIG. 10.

FIG. 10 is a block diagram of circuit 52 of FIG. 7 (or any of FIGS. 8, 9, and 10). As shown in FIG. 10, circuit 52 comprises eight identical circuits 62. Each circuit 62 (whose preferred structure is shown in FIG. 12) has four inputs, of which the inputs labeled A', B', and C' receive address bits, and the input labeled T' receives bit WLSHIGH. Each circuit 62 receives a different set of address and control bits at its A', B', and C' inputs, and outputs the inverse of one of bits XAL(7:0) (or the inverse of one of bits XAR(7:0). Specifically, circuits 62 within circuit 50L (in order from the top to the bottom of FIG. 10) receive the following bits at their inputs A', B', and C' and their inverted outputs are as follows:

| A' | B' | C' | Inverted Output |
|---|---|---|---|
| A | A11 | A12 | XAL7 |
| A__ | A11 | A12 | XAL6 |
| A | A__11 | A12 | XAL5 |
| A__ | A__11 | A12 | XAL4 |
| A | A11 | A__12 | XAL3 |
| A__ | A11 | A__12 | XAL2 |
| A | A__11 | A__12 | XAL1 |
| A__ | A__11 | A__12 | XAL0, |

When circuit 62 is implemented in circuit 50L, A__ is the output of gate 56, and A is the output of inverter 57 (as noted above). When circuit 62 is implemented in circuit 150L, it should be understood that the values A12, A11, A, and A__ in the above table denote bits AL12, AL11, AL10, and AL__10.

Circuits 62 within circuit 50R (in order from the top to the bottom of FIG. 10) receive the following bits at their inputs A', B', and C' and their inverted outputs are as follows:

| A' | B' | C' | Inverted Output |
|---|---|---|---|
| A | A11 | A12 | XAR7 |
| A__ | A11 | A12 | XAR6 |
| A | A__11 | A12 | XAR5 |
| A__ | A__11 | A12 | XAR4 |
| A | A11 | A__12 | XAR3 |
| A__ | A11 | A__12 | XAR2 |
| A | A__11 | A__12 | XAR1 |
| A__ | A__11 | A__12 | XAR0, |

When circuit 62 is implemented in circuit 50R, A__ is the output of gate 56, and A is the output of inverter 57 (as noted above). When circuit 62 is implemented in circuit 150R, it should be understood that the values A12, A11, A, and A__ in the above table denote bits AR12, AR11, AR10, and AR__10.

FIG. 11 is a schematic diagram of a preferred embodiment of one of circuits 61. As shown in FIG. 11, this embodiment comprises five NMOS transistors connected as shown (with the control gate of each receiving a different one of inputs A', B', C', D', and T') and five PMOS transistors connected as shown (with the control gate of each receiving a different one of inputs A', B', C', D', and T').

FIG. 12 is a schematic diagram of a preferred embodiment of one of circuits 62. As shown in FIG. 12, this embodiment comprises four NMOS transistors connected as shown (with the control gate of each receiving a different one of inputs A', B', C', and T') and four PMOS transistors connected as shown (with the control gate of each receiving a different one of inputs A', B', C', and T').

In a mode of operation of a preferred embodiment of system 30 (in which predecoder 50 includes circuits 50L and 50R), circuits 50L and 50R assert multi-row selection bits for simultaneously selecting a target row of cells (a target wordline) and all rows shorted with the target row (all rows connected along wordlines shorted with the target wordline), and controller 129 asserts control bit WLSHIGH with a low value (representing a logical "0") and control bit WLow__ with a high value (representing a logical "1"). Controller 129 also loads appropriate values of control bits C1, C2, and C3 into registers 40–42, and asserts appropriate values of address bits A(10:9) to circuit 50R and A(10:9) to circuit 50L.

As an example of this mode of operation, consider the case in which the target wordline is WL2 (the second even-numbered wordline driven by a driver within set 12A as shown in FIG. 2) and wordline WL1 is shorted with wordline WL2 (where wordline WL1 is the first odd-numbered wordline driven by a driver within set 12B as shown in FIG. 2). In this example, controller 129 would assert address bit A9 with the value 0, address bit A10 with the value 0, and all of address bits A(15:11) with the value 0, and would assert control bits WLow_ and WLSHIGH with the values 1 and 0, respectively. Controller 129 would also load register 40 with control bit C1 having the value 1, register 41 with control bit C2 having the value 1, and register 42 with control bit C3 having the value 0. Circuits 50L and 50R would receive bits A(15:9), their inverses A_(15:9), and bits WLow_, WLSHIGH, C1, C2, and C3, and would produce multi-row selection bits XAR(7:0), XAL(7:0), XBR(7:0), and XBL(7:0) in response thereto. Specifically, in response to the received bits, the output of gate 55 of both of circuits 50L and 50R would have a high level (a logical 1), the output of gate 57 of circuit 50L would have a high level (a logical 1), and the output of gate 57 of circuit 50R would have a low level (a logical 0). Thus: circuit 52L would output the bits XAL7=XAL6=XAL5=XAL4=XAL3=XAL2=XAL0=0, and XAL1=1; circuit 51L would output the bits XBL7=XBL6=XBL5=XBL4=XBL3=XBL2=XBL1=0, and XBL0=1; circuit 52R would output the bits XAR7=XAR6=XAR5=XAR4=XAR3=XAR2=XAR1=0, and XAR0=1; and circuit 51R would output the bits XBR7=XBR6=XBR5=XBR4=XBR3=XBR2=XBR1=0, and XBR0=1. These values of bits XAR(7:0), XAL(7:0), XBR(7:0), and XBL(7:0) would cause decoder 12 to select (simultaneously) both wordline WL1 and wordline WL2.

Predecoder 50 would operate in the same manner if the roles of the shorted-together wordlines are reversed, so that the target wordline is WL1 and wordline WL2 is shorted with wordline WL1. In both cases in which WL1 and WL2 are shorted together, controller 129 would assert all of address bits A(15:9) with the value 0, controller 129 would assert control bits WLow_ and WLSHIGH with the respective values 1 and 0, and controller 129 would load register 40 with control bit C1 having the value 1, register 41 with control bit C2 having the value 1, and register 42 with control bit C3 having the value 0. In response, predecoder 50 (in both cases) would assert selection bits XAR(7:0), XAL(7:0), XBR(7:0) and XBL(7:0) with values causing decoder 12 to select both wordlines WL1 and WL2 simultaneously.

Due to the specific structure of circuits 51 and 52 of FIGS. 7–12, the above-described preferred embodiment of predecoder 50 is designed to assert multirow selection bits for selecting only two shorted-together wordlines (when WLSHIGH is low): one even-numbered wordline and one odd-numbered wordline. In alternative embodiments, predecoder 50 is designed so that it asserts (in response to appropriate address and control bits from controller 129) multirow selection bits for simultaneously selecting a target wordline (row) and all wordlines (regardless of whether they are odd-numbered or even-numbered) shorted with the target wordline (where there may be more than one wordline shorted with the target wordline).

With reference again to the preferred embodiment of FIGS. 1–12 (in which predecoder 50 includes circuits 50L and 50R), predecoder 50 is operable in other modes (in response to different values of bits C1–C3, WLow_, and WLSHIGH).

In one such alternative mode, predecoder 50 asserts multirow selection bits for causing decoder 12 to select all wordlines of an erase block (in response to assertion of bit WLSHIGH with a high level). In this mode, controller 129 asserts WLSHIGH with a high level (a logical "1"), and in response, the output of each circuit 61 and 62 (within each of circuits 51 and 52) is low. Thus, each of selection bits XAR(7:0), XAL(7:0), XBR(7:0), and XBL(7:0) is high (a logical "1").

In another such alternative mode, predecoder 50 asserts selection bits for causing decoder 12 to deselect all wordlines of an erase block (in response to assertion of bit WLow_ with a low level, and bit WLSHIGH with a low level). In this mode, controller 129 asserts WLow_ with a low level (a logical "0"), and in response, the output of NOR gate 55 (the bit "WLSLOW_") is low (a logical "0"). In response to the low value of bit WLSLOW_ (and the low value of bit WLSHIGH), the output of each circuit 61 (within each of circuits 51) is high. Thus, each of selection bits XBR(7:0) and XBL(7:0) is low (a logical "0"). In response to such values of bits XBR(7:0) and XBL(7:0), decoder 12 will deselect all wordlines of the erase block (regardless of the values of XAR(7:0) and XAL(7:0)).

With reference again to FIG. 1, each of control bit registers 40, 41, and 42 can be implemented either as a nonvolatile register of the type described in U.S. patent application Ser. No. 08/563,505, filed Nov. 28, 1995 (and assigned to the assignee of the present application). The referenced application describes a method and apparatus for storing control bits in nonvolatile registers and for using such registers to store control bits so that the control bits are accessible to address bit processing circuitry. The text of U.S. patent application Ser. No. 08/563,505 is incorporated herein by reference.

In another class of embodiments, registers 40, 41, and 42 are implemented as volatile memories (each register being capable of storing one bit in volatile fashion). In such embodiments, each register preferably includes a decoding circuit which receives register control bits from control engine 129 and generates write control bits (or read control bits) from the register control bits, and latch circuitry. The latch circuitry receives the write control bits from the decoding circuit, temporarily stores an input data bit in response to the write control bits, and asserts the stored data bit to predecoder 50. In response to the read control bits, the latch circuitry also asserts the data bits stored therein to output buffer 10, from which they can be asserted to an external drive through interface 4.

Another aspect of the invention is a logic circuit (e.g., above-described predecoder 50 or any of the above-mentioned variations thereon) which generates multirow selection bits in response to control signals and address bits, where the multirow selection bits are for processing by array interface circuitry to cause the array interface circuitry to select simultaneously at least two shorted-together wordlines of a memory array. The logic circuit preferably includes an odd-wordline predecoder for generating selection bits for selecting an odd-numbered wordline of an erase block, and an even-wordline predecoder for generating selection bits for selecting an even-numbered wordline of the erase block (where all even-numbered wordlines of the erase block are driven by a first set of driver circuits and all odd-numbered wordlines of the erase block are driven by a second set of driver circuits). The logic circuit preferably is operable in a first mode in which it outputs multirow selection bits which can be processed to simultaneously select an odd-numbered wordline of an erase block and an even-numbered wordline (of the same erase block) which is shorted with the odd-numbered wordline. Preferably, the logic circuit is also operable in any selected one of the following modes (at times when it is not operating in the first mode): a second mode in which it asserts single row selection bits in response to address bits and at least one control bit (where the address and control bits determine a single wordline of the erase block), a third mode in which it asserts all-row selection bits in response to address bits and at least one control bit (where the address bits select an erase block and the all-row selection bits select all the wordlines of the selected erase block), and a fourth mode in which it asserts row deselection bits in response to address bits and at least one control bit (where the address bits select an erase block, and the row deselection bits deselect all wordlines of the selected erase block).

Other aspects of the invention are methods (which can be implemented by above-described memory system 30 and the above-mentioned variations thereon) for simultaneously selecting shorted-together wordlines of a memory cell array.

One such method is for selecting a target wordline of an array of memory cells connected along wordlines and bitlines, where the target wordline is shorted with at least a second one of the wordlines, said method including the steps of:

(a) in response to a command requiring selection of the target wordline, generating address bits identifying the target wordline and the second one of the wordlines;

(b) supplying the address bits to logic circuitry, and asserting selection bits from the logic circuitry in response to the address bits; and (c) simultaneously selecting the target wordline and the second one of the wordlines in response to the selection bits.

In preferred implementations, a first subset of the wordlines is driven by a first set of wordline drivers, a second subset of the wordlines is driven by a second set of wordline drivers positioned along another side of the array, the target wordline is a member of the first subset, and the second one of the wordlines is a member of the second subset (preferably, the first set of wordline drivers is positioned along one side of the array, and the second set of the wordline drivers is positioned along another side of the array). In some such preferred implementations, the logic circuitry includes first wordline predecoder circuitry and second wordline predecoder circuitry, and step (b) includes the steps of: processing a first subset of the address bits in the first wordline predecoder circuitry to produce first selection bits for selecting the target wordline, and processing a second subset of the address bits in the second wordline predecoder circuitry to produce second selection bits for selecting the second one of the wordlines. In other such preferred implementations, the logic circuitry includes first wordline predecoder circuitry and second wordline predecoder circuitry, and step (b) includes the steps of: supplying the address bits and a first set of at least one control bit to the first wordline predecoder circuitry, processing the address bits and the first set of at least one control bit in said 5 first wordline predecoder circuitry to produce first selection bits for selecting the target wordline, supplying the address bits and a second set of at least one control bit to the second wordline predecoder circuitry, and processing the address bits 10 and the second set of at least one control bit in said second wordline predecoder circuitry to produce second selection bits for selecting the second one of the wordlines. In other implementations, the target wordline is shorted with at least a third one of the wordlines in addition to the second one of the wordlines, the address bits generated in step (a) identify the third one of the wordlines in addition to the target wordline and the second one of the wordlines, and step (c) includes the step of simultaneously selecting the target wordline, the second one of the wordlines, and the third one of the wordlines. In another preferred implementation, the command is a programming command (requiring performance of a programming operation on cells connected along at least the target wordline).

In other embodiments, the invention is a method for selecting a target wordline of an array of memory cells connected along wordlines and bitlines, wherein the target wordline is shorted with a second one of the wordlines, the method including the steps of:

(a) loading at least one control bit in at least one register, wherein the at least one control bit indicates that the target wordline is shorted with the second one of the wordlines;

(b) in response to a command requiring selection of the target wordline, generating address bits identifying the target wordline and the second one of the wordlines;

(c) supplying the address bits and the at least one control bit to logic circuitry, and asserting selection bits from the logic circuitry in response to the address bits and the at least one control bit; and (d) simultaneously selecting the target wordline and the second one of the wordlines in response to the selection bits.

In preferred implementations, a first subset of the wordlines is driven by a first set of wordline drivers (preferably positioned along one side of the array), a second subset of the wordlines is driven by a second set of wordline drivers (preferably positioned along another side of the array), the target wordline is a member of the first subset of the wordlines, and the second one of the wordlines is a member of the second subset of the wordlines. In other preferred implementations, the logic circuitry includes first wordline predecoder circuitry and second wordline predecoder circuitry, and step (c) includes the steps of: processing the address bits and at least a first subset of said at least one control bit in the first wordline predecoder circuitry to produce first selection bits for selecting the target wordline, and processing the address bits and at least a second subset of said at least one control bit in the second wordline predecoder circuitry to produce second selection bits for selecting the second one of the wordlines. In other implementations, the target wordline is shorted with at least a third one of the wordlines in addition to the second one of the wordlines, the address bits generated in step (b) identify the third one of the wordlines in addition to the target wordline and the second one of the wordlines, and step (d) includes the step of simultaneously selecting the target wordline, the second one of the wordlines, and the third one of the wordlines.

In other embodiments, the invention is a method for operating a memory system to select a target wordline of an array of memory cells connected along wordlines and bitlines, wherein the target wordline is shorted with a second one of the wordlines, wherein the system includes a first set of wordline drivers coupled to drive a first group of the wordlines, a second set of wordline drivers coupled to drive a second group of the wordlines, and logic circuitry, and wherein the target wordline is a member of the first group and the second one of the wordlines is a member of the second group, the method including the steps of:

(a) in response to a command requiring selection of the target wordline, generating a first set of address bits identifying the target wordline and a second set of address bits identifying the second one of the wordlines;

(b) supplying the first set of address bits and the second set of address bits to the logic circuitry, and asserting selection bits from the logic circuitry in response to said first set of address bits and said second set of address bits; and (c) simultaneously selecting the target wordline and the second one of the wordlines in response to the selection bits.

Preferred and alternative embodiments of the invention have been described with reference to FIGS. 1–14. Although these embodiments have been described in some detail, it is contemplated that changes from these embodiments can be made without departing from the scope of the invention as defined by the appended claims.

What is claimed is:

1. A method for selecting a target wordline of an array of memory cells connected along wordlines and bitlines, where the target wordline is shorted with at least a second one of the wordlines, said method including:

(a) in response to a command requiring selection of the target wordline, generating address bits identifying the target wordline and the second one of the wordlines;

(b) supplying the address bits to logic circuitry, and asserting selection bits from the logic circuitry in response to the address bits; and (c) simultaneously selecting the target wordline and the second one of the wordlines in response to the selection bits.

2. The method of claim 1, wherein a first subset of the wordlines is driven by a first set of wordline drivers, a second subset of the wordlines is driven by a second set of wordline drivers, the target wordline is a member of the first subset of the wordlines, and the second one of the wordlines is a member of the second subset of the wordlines.

3. The method of claim 2, wherein the first set of wordline drivers is positioned along one side of the array, and the second set of the wordline drivers is positioned along another side of the array.

4. The method of claim 2, wherein the logic circuitry includes first wordline predecoder circuitry and second wordline predecoder circuitry, and supplying the address bits to the logic circuitry and asserting selection bits includes:

processing a first subset of the address bits in the first wordline predecoder circuitry to produce first selection bits for selecting the target wordline; and processing a second subset of the address bits in the second wordline predecoder circuitry to produce second selection bits for selecting the second one of the wordlines.

5. The method of claim 2, wherein the logic circuitry includes first wordline predecoder circuitry and second wordline predecoder circuitry, and supplying the address bits to the logic circuitry and asserting selection bits includes:

supplying the address bits and a first set of at least one control bit to the first wordline predecoder circuitry, and processing the address bits and the first set of at least one control bit in said first wordline predecoder circuitry to produce first selection bits for selecting the target wordline; and supplying the address bits and a second set of at least one control bit to the second wordline predecoder circuitry, and processing the address bits and the second set of at least one control bit in said second wordline predecoder circuitry to produce second selection bits for selecting the second one of the wordlines.

6. The method of claim 5, wherein the first set of at least one control bit is identical to the second set of at least one control bit.

7. The method of claim 1, wherein the target wordline is shorted with at least a third one of the wordlines in addition to the second one of the wordlines, the address bits identify the third one of the wordlines in addition to the target wordline and the second one of the wordlines, and simultaneously selecting the target wordline and the second one of the wordlines further includes simultaneously selecting the third one of the wordlines in response to the selection bits.

8. The method of claim 1, wherein the command is a programming command requiring performance of a programming operation on cells connected along at least the target wordline.

9. A method for selecting a target wordline of an array of memory cells connected along wordlines and bitlines, wherein the target wordline is shorted with a second one of the wordlines, said method including:

(a) loading at least one control bit in at least one register, wherein the at least one control bit indicates that the target wordline is shorted with the second one of the wordlines;

(b) in response to a command requiring selection of the target wordline, generating address bits identifying the target wordline and the second one of the wordlines;

(c) supplying the address bits and the at least one control bit to logic circuitry, and asserting selection bits from the logic circuitry in response to the address bits and the at least one control bit; and (d) simultaneously selecting the target wordline and the second one of the wordlines in response to the selection bits.

10. The method of claim 9, wherein a first subset of the wordlines is driven by wordline drivers positioned along one side of the array, a second subset of the wordlines is driven by wordline drivers positioned along another side of the array, the target wordline is a member of the first subset of the wordlines, and the second one of the wordlines is a member of the second subset of the wordlines.

11. The method of claim 9, wherein the logic circuitry includes first wordline predecoder circuitry and second wordline predecoder circuitry, and supplying the address bits and asserting selection bits includes:

processing the address bits and at least a first subset of said at least one control bit in the first wordline predecoder circuitry to produce first selection bits for selecting the target wordline; and processing the address bits and at least a second subset of said at least one control bit in the second wordline predecoder circuitry to produce second selection bits for selecting the second one of the wordlines.

12. The method of claim 9, wherein the target wordline is shorted with at least a third one of the wordlines in addition to the second one of the wordlines, the address bits identify the third one of the wordlines in addition to the target wordline and the second one of the wordlines, and simultaneously selecting the target wordline and the second one of the wordlines further includes simultaneously selecting the third one of the wordlines in response to the selection bits.

13. The method of claim 9, wherein the command is a programming command requiring performance of a programming operation on cells connected along at least the target wordline.

14. A method for operating a memory system to select a target wordline of an array of memory cells connected along wordlines and bitlines, wherein the target wordline is shorted with a second one of the wordlines, wherein the system includes a first set of wordline drivers coupled to drive a first group of the wordlines, a second set of wordline drivers coupled to drive a second group of the wordlines, and logic circuitry, and wherein the target wordline is a member of the first group and the second one of the wordlines is a member of the second group, said method including:

(a) in response to a command requiring selection of the target wordline, generating a first set of address bits identifying the target wordline and a second set of address bits identifying the second one of the wordlines;

(b) supplying the first set of address bits and the second set of address bits to the logic circuitry, and asserting selection bits from the logic circuitry in response to said first set of address bits and said second set of address bits; and (c) simultaneously selecting the target wordline and the second one of the wordlines in response to the selection bits.

15. The method of claim 14, wherein the logic circuitry includes first wordline predecoder circuitry and second wordline predecoder circuitry, and supplying the first and second sets of address bits includes:

processing the first subset of the address bits in the first wordline predecoder circuitry to produce first selection bits for selecting the target wordline; and processing the second subset of the address bits in the second wordline predecoder circuitry to produce second selection bits of selecting the second one of the wordlines.

16. A memory system, including:

an array of memory cells connected along wordlines and bitlines, wherein the array is organized in erase blocks of the memory cells, each of the erase blocks comprises even-numbered wordlines and odd-numbered wordlines, each wordline in a first group is an even-numbered wordline, and each wordline in a second group is an odd-numbered wordline;

wordline driver circuitry coupled to the array and configured to select and drive at least one selected one of the wordlines in response to selection bits, and to select and drive at least two selected ones of the wordlines simultaneously in response to multirow selection bits, wherein the wordline driver circuitry includes:

a row decoder coupled to receive the selection bits and the multirow selection bits, and configured to generate a set of decoded selection bits in response to each set of the selection bits, to generate a first subset of decoded multirow selection bits in response to a first subset of each set of the multirow selection bits, and to generate a second subset of decoded multirow selection bits in response to a second subset of said each set of the multirow selection bits;

a first set of wordline drivers coupled to drive a first group of the wordlines in response to the first subset of decoded multirow selection bits; and a second set of wordline drivers coupled to drive a second group of the wordlines in response to the second subset of decoded multirow selection bits, wherein each of the first group and the second group includes at least one of the wordlines; and selection bit circuitry coupled to the wordline driver circuitry and operable to assert the multirow selection bits to the wordline driver circuitry in response to address bits, thereby causing the wordline driver circuitry to select simultaneously a target wordline and at least a second wordline shorted with the target wordline, wherein the selection bit circuitry is a logic circuit including:

an even-wordline predecoder operable to assert to the row decoder the first subset of each set of the multirow selection bits; and an odd-wordline predecoder operable to assert to the row decoder the second subset of said each set of the multirow selection bits.

17. The system of claim 16 wherein the selection bit circuitry is a logic circuit.

18. The system of claim 16, wherein the selection bit circuitry is operable to assert the multirow selection bits to the wordline driver circuitry in response to control signals and in response to said address bits.

19. The system of claim 16, wherein the selection bit circuitry is a logic circuit.

20. The system of claim 16, wherein the odd-wordline predecoder and the even-wordline predecoder are operable in a first mode in which they assert the multirow selection bits to the row decoder, the target wordline is in one of the first group and the second group of the wordlines, and the second wordline is in the other of the first group and the second group of the wordlines.

21. The system of claim 20, wherein the odd-wordline predecoder and the even-wordline predecoder are operable in a second mode in which they assert a first set of the selection bits to the row decoder in response to at least one control bit, and wherein the row decoder generates a first set of decoded selection bits in response to the first set of the selection bits, and the first set of wordline drivers and the second set of wordline drivers drive all the wordlines of one of the erase blocks in response to the first set of decoded selection bits.

22. The system of claim 20, wherein the odd-wordline predecoder and the even-wordline predecoder are operable in a third mode in which they assert a second set of the selection bits to the row decoder in response to at least one control bit, and wherein the row decoder generates a second set of decoded selection bits in response to the second set of the selection bits, and the first set of wordline drivers and the second set of wordline drivers drive none of the wordlines of a selected one of the erase blocks in response to the second set of decoded selection bits.

23. The system of claim 20, also including:

a controller operable to assert a first subset of the address bits to the even-wordline predecoder and a second subset of the address bits to the odd-wordline predecoder, wherein the even-wordline predecoder asserts to the row decoder the first subset of each set of the multirow selection bits in response to the first subset of the address bits, and wherein the odd-wordline predecoder asserts to the row decoder the second subset of each set of the multirow selection bits in response to the second subset of the address bits.

24. The system of claim 20, also including:

a controller operable to assert the address bits to the even-wordline predecoder and to assert said address bits to the odd-wordline predecoder, wherein the even-wordline predecoder asserts to the row decoder the first subset of each set of the multirow selection bits in response to said address bits and a first set of control signals, and wherein the odd-wordline predecoder asserts to the row decoder the second subset of each set of the multirow selection bits in response to said address bits and a second set of control signals.

25. The system of claim 24, wherein the first set of control signals is identical to the second set of control signals.

26. The system of claim 24, wherein the first set of control signals and the second set of control signals are determined by a set of control bits, wherein the system also includes at least one register, wherein the controller is configured to load the set of control bits into said at least one register, wherein each of the odd-wordline predecoder and the even-wordline predecoder is coupled to said at least one register to receive at least a subset of the set of control bits, and wherein the odd-wordline predecoder and the even-wordline predecoder assert the multirow selection bits to the wordline driver circuitry in response to the control bits and the address bits.

27. The system of claim 20, wherein the even-wordline predecoder has structure at least substantially identical to that of the odd-wordline predecoder.

28. The system of claim 27, wherein the even-wordline predecoder has structure identical to that of the odd-wordline predecoder.

29. The system of claim 16, wherein the memory cells are flash memory cells.

30. A memory system, including:
an array of memory cells connected along wordlines and bitlines;
wordline driver circuitry coupled to the array, and configured to select and drive at least one selected one of the wordlines in response to selection bits, and to select and drive at least two selected ones of the wordlines simultaneously in response to multirow selection bits;
a controller operable, in response to a command requiring selection of a target wordline, to generate address bits and control bits, wherein the address bits and the control bits identify the target wordline and at least a second one of the wordlines shorted with the target wordline; and
logic circuitry coupled to the wordline driver circuitry and to the controller, and operable to assert the multirow selection bits to the wordline driver circuitry in response to the control bits and the address bits, thereby causing the wordline driver circuitry to select simultaneously the target wordline and the second wordline.

31. The system of claim 30, wherein the logic circuitry includes:
first wordline predecoder circuitry configured to receive and process the address bits and at least a first subset of the control bits to produce first selection bits for selecting the target wordline; and
second wordline predecoder circuitry configured to receive and process the address bits and at least a second subset of the control bits to produce second selection bits for selecting the second one of the wordlines.

32. The system of claim 30, wherein the wordline driver circuitry includes:
a first circuit positioned along one side of the array and configured to drive a first subset of the wordlines; and
a second circuit positioned along another side of the array and configured to drive a second subset of the wordlines, wherein the target wordline is a member of the first subset, and the second one of the wordlines is a member of the second subset.

33. The system of claim 32, wherein the logic circuitry includes:
first wordline predecoder circuitry configured to receive and process the address bits and at least a first subset of the control bits to produce first selection bits for selecting the target wordline; and
second wordline predecoder circuitry configured to receive and process the address bits and at least a second subset of the control bits to produce second selection bits for selecting the second one of the wordlines.

34. The system of claim 30, wherein the command is a programming command requiring performance of a programming operation on cells connected along at least the target wordline.

35. A memory system, including:
an array of memory cells connected along wordlines and bitlines;
wordline driver circuitry coupled to the array, and configured to select and drive at least one selected one of the wordlines in response to selection bits, and to select and drive at least two selected ones of the wordlines simultaneously in response to multirow selection bits;
at least one register;
a controller coupled to the at least one register and operable to load in said at least one register at least one control bit, wherein the controller is also operable in response to a command requiring selection of the target wordline to generate address bits, wherein the address bits identify the target wordline and the second one of the wordlines; and
logic circuitry coupled to the controller and to the at least one register, and operable to assert a first set of the multirow selection bits to the wordline driver circuitry in response to the address bits, thereby causing the wordline driver circuitry to select simultaneously the target wordline and the second wordline.

36. The system of claim 35, wherein the at least one control bit indicates that a target wordline is shorted with a second one of the wordlines, and wherein the logic circuitry is operable to assert the first set of the multirow selection bits to the wordline driver circuitry in response to the address bits and said at least one control bit.

37. The system of claim 35, wherein the wordline driver circuitry includes:
a first circuit positioned along one side of the array and configured to drive a first subset of the wordlines; and
a second circuit positioned along another side of the array and configured to drive a second subset of the wordlines, wherein the target wordline is a member of the first subset, and the second one of the wordlines is a member of the second subset.

38. The system of claim 35, wherein the logic circuitry includes:
first wordline predecoder circuitry configured to receive and process a first subset of the address bits to produce first selection bits for selecting the target wordline; and
second wordline predecoder circuitry configured to receive and process a second subset of the address bits to produce second selection bits for selecting the second one of the wordlines.

39. The system of claim 35, wherein the logic circuitry includes:
   first wordline predecoder circuitry configured to receive and process the address bits and at least a first subset of the at least one control bit to produce first selection bits for selecting the target wordline; and
   second wordline predecoder circuitry configured to receive and process the address bits and at least a second subset of the at least one control bit to produce second selection bits for selecting the second one of the wordlines.

40. The system of claim 35, wherein the command is a programming command requiring performance of a programming operation on cells connected along at least the target wordline.

41. A predecoding circuit for use with a memory system, wherein the memory system includes an array of memory cells connected along wordlines and bitlines, and a controller operable to generate address bits in response to a command requiring selection of a target wordline, wherein the address bits identify the target wordline and at least a second one of the wordlines shorted with the target wordline, said predecoding circuit including:
   a first logic circuit configured to receive and process a first subset of the address bits to produce a first set of selection bits for selecting the target wordline; and
   a second logic circuit configured to receive and 15 process a second subset of the address bits to produce a second set of selection bits for selecting the second one of the wordlines simultaneously with the target wordline.

42. The predecoding circuit of claim 41, wherein the array is organized in erase blocks of the memory cells, each of the erase blocks comprises even-numbered wordlines and odd-numbered wordlines, the target wordline is one of the even-numbered wordlines, and the second wordline is one of the odd-numbered wordlines.

43. The predecoding circuit of claim 41, wherein the array is organized in erase blocks of the memory cells, each of the erase blocks comprises even-numbered wordlines and odd-numbered wordlines, the target wordline is one of the odd-numbered wordlines, and the second wordline is one of the even-numbered wordlines.

44. The predecoding circuit of claim 41, wherein the array is organized in erase blocks of the memory cells, the controller is operable to generate a control bit set in response to the command to select all wordlines of a selected one of the erase blocks, and the first logic circuit and the second logic circuit are operable in a mode in which they receive and process the control bit set to produce a third set of the selection bits for selecting all the wordlines of the selected one of the erase blocks.

45. The predecoding circuit of claim 41, wherein the array is organized in erase blocks of the memory cells, the controller is operable to generate a control bit set in response to the command to deselect all wordlines of a selected one of the erase blocks, and the first logic circuit and the second logic circuit are operable in a mode in which they receive and process the control bit set to produce a third set of the selection bits for deselecting all the wordlines of the selected one of the erase blocks.

46. A predecoding circuit for use with a memory system, wherein the memory system includes an array of memory cells connected along wordlines and bitlines, and a controller operable to generate address bits and a first control bit set in response to a command requiring selection of a target wordline, wherein the address bits and the first control bit set identify the target wordline and at least a second one of the wordlines shorted with the target wordline, said predecoding circuit including:
   a first logic circuit configured to receive and process the address bits and a first subset of the first control bit set to produce a first set of selection bits for selecting the target wordline; and
   a second logic circuit configured to receive and process the address bits and a second subset of the first control bit set to produce a second set of selection bits for selecting the second one of the wordlines simultaneously with the target wordline.

47. The predecoding circuit of claim 46, wherein the array is organized in erase blocks of the memory cells, each of the erase blocks comprises even numbered wordlines and odd-numbered wordlines, the target wordline is one of the even-numbered wordlines, and the second wordline is one of the odd-numbered wordlines.

48. The predecoding circuit of claim 46, wherein the array is organized in erase blocks of the memory cells, each of the erase blocks comprises even-numbered wordlines and odd-numbered wordlines, the target wordline is one of the odd-numbered wordlines, and the second wordline is one of the even-numbered wordlines.

49. The predecoding circuit of claim 46, wherein the array is organized in erase blocks of the memory cells, the controller is operable to generate a second control bit set in response to the command to select all wordlines of a selected one of the erase blocks, and the first logic circuit and the second logic circuit are operable in a mode in which they receive and process the second control bit set to produce a third set of the selection bits for selecting all the wordlines of the selected one of the erase blocks.

50. The predecoding circuit of claim 46, wherein the array is organized in erase blocks of the memory cells, the controller is operable to generate a second control bit set in response to the command to deselect all wordlines of a selected one of the erase blocks, and the first logic circuit and the second logic circuit are operable in a mode in which they receive and process the second control bit set to produce a third set of the selection bits for deselecting all the wordlines of the selected one of the erase blocks.

51. A method for selecting a target wordline of an array of memory cells interconnected by wordlines and bitlines, wherein the target wordline is shorted with a second one of the wordlines, the method comprising:
   providing at least one control bit that indicates that the target wordline is shorted with the second one of the wordlines;
   generating address bits identifying the target wordline and the second one of the wordlines;
   asserting selection bits based on the at least one control bit and the generated address bits; and
   simultaneously selecting the target wordline and the second one of the wordlines in response to the address bits selection bits.

52. The method of claim 51, wherein a first subset of the wordlines is driven by wordline drivers positioned along one side of the array, a second subset of the wordlines is driven by wordline drivers positioned along another side of the array, the target wordline is a member of the first subset of the wordlines, and the second one of the wordlines is a member of the second subset of the wordlines.

53. The method of claim 51, wherein the target wordline is shorted with at least a third one of the wordlines in addition to the second one of the wordlines, the address bits identify the third one of the wordlines in addition to the target wordline and the second one of the wordlines, and simultaneously selecting the target wordline and the second one of the wordlines further includes simultaneously selecting the third one of the wordlines in response to the selection bits.

54. A memory system, including:

an array of memory cells connected along wordlines and bitlines;

wordline driver circuitry responsive to selection bits to select and drive at least one of the wordlines and responsive to multirow selection bits to select and drive at least two of the wordlines simultaneously;

a controller responsive to a command requiring selection of a target wordline to generate address bits and control bits which identify the target wordline and all the wordlines shorted with the target wordline; and logic circuitry responsive to the address bits and control bits to assert the multirow selection bits to the wordline driver circuitry, which cause the wordline driver circuitry to select simultaneously the target wordline and all the wordlines shorted with the target wordline.

* * * * *

UNITED STATES PATENT AND TRADEMARK OFFICE
CERTIFICATE OF CORRECTION

PATENT NO. : 5,898,637
DATED : Apr. 27, 1999
INVENTOR(S) : Vinod Lakhani, et al.

It is certified that error appears in the above-identified patent and that said Letters Patent is hereby corrected as shown below:

At Col. 27, line 45, please delete "the".

At Col. 27, line 57, please delete "the".

At Col. 30, line 17, please insert --,-- after "16".

At Col. 33, line 27, please delete "15".

Signed and Sealed this

Eighteenth Day of January, 2000

Attest:

Q. TODD DICKINSON

*Attesting Officer*   *Commissioner of Patents and Trademarks*